(12) United States Patent
Rosenbaum et al.

(10) Patent No.: US 10,135,339 B1
(45) Date of Patent: Nov. 20, 2018

(54) HIGH-SPEED OPEN-LOOP SWITCH-MODE BOOST CONVERTER

(71) Applicant: Silanna Asia Pte Ltd, Singapore (SG)

(72) Inventors: Steven E. Rosenbaum, San Diego, CA (US); Stuart B. Molin, Carlsbad, CA (US)

(73) Assignee: SILANNA ASIA PTE LTD, Singapore (SG)

( * ) Notice: Subject to any disclaimer, the term of this patent is extended or adjusted under 35 U.S.C. 154(b) by 0 days.

(21) Appl. No.: 15/879,284

(22) Filed: Jan. 24, 2018

(51) Int. Cl.
| | |
|---|---|
| *H02M 3/155* | (2006.01) |
| *H02M 3/158* | (2006.01) |
| *H03F 3/185* | (2006.01) |
| *H03F 3/193* | (2006.01) |
| *H02M 3/156* | (2006.01) |
| *H03F 3/21* | (2006.01) |

(52) U.S. Cl.
CPC .......... *H02M 3/158* (2013.01); *H02M 3/156* (2013.01); *H03F 3/185* (2013.01); *H03F 3/193* (2013.01); *H03F 3/21* (2013.01); *H03F 2200/03* (2013.01); *H03F 2200/102* (2013.01); *H03F 2200/451* (2013.01)

(58) Field of Classification Search
CPC .................. H02M 3/02; H02M 3/155; H02M 2003/1552; H02M 2003/1555; H02M 2003/1557; H02M 3/156; H02M 3/158; H02M 1/4225; H03F 3/185; H03F 3/193
See application file for complete search history.

(56) References Cited

U.S. PATENT DOCUMENTS

| | | | | |
|---|---|---|---|---|
| 5,233,508 A | * | 8/1993 | Yamamura | H02M 1/36 323/222 |
| 5,475,296 A | * | 12/1995 | Vinsant | H02M 3/157 323/223 |

(Continued)

OTHER PUBLICATIONS

Asbeck and Popovic, ET Comes of Age: Envelope Tracking for Higher-Efficiency Power Amplifiers, IEEE Microwave Magazine, vol. 17, No. 3, pp. 16-25, Mar. 2016.

(Continued)

*Primary Examiner* — Gary L Laxton
(74) *Attorney, Agent, or Firm* — The Mueller Law Office, P.C.

(57) ABSTRACT

An open-loop switch-mode boost converter includes a switching signal generator circuit that receives a time-varying input signal and outputs a switching signal. A duty-cycle of the switching signal has a first non-linear relationship to an amplitude of the time-varying input signal. An amplifier receives the switching signal and outputs a time-varying output signal, an amplitude of which has a second non-linear relationship to the duty-cycle of the switching signal. The time-varying output signal has a linear relationship to the time-varying input signal based on the first non-linear relationship and the second non-linear relationship. A filter circuit receives the time-varying output signal and outputs a filtered time-varying output signal which has a maximum frequency component that is substantially the same as a maximum frequency component of the time-varying input signal. The switching signal generator circuit is communicatively isolated from the voltage output node and the filter output node.

20 Claims, 14 Drawing Sheets

(56) References Cited

U.S. PATENT DOCUMENTS

| | | | |
|---|---|---|---|
| 6,348,781 B1 * | 2/2002 | Midya | H03F 1/0227 |
| | | | 323/222 |
| 7,084,799 B1 * | 8/2006 | Butler | H03F 3/2175 |
| | | | 341/143 |
| 2006/0132234 A1 | 6/2006 | Nguyen | |
| 2008/0224769 A1 | 9/2008 | Markowski et al. | |
| 2012/0062323 A1 | 3/2012 | Gallou et al. | |
| 2015/0126141 A1 | 5/2015 | Amo | |

OTHER PUBLICATIONS

Michal, Modulated-Ramp PWM Generator for Linear Control of the Boost Converter's Power Stage, IEEE Transactions on Power Electronics, vol. 27, No. 6, pp. 2958-2965, Jun. 2012.

Sardin, Nicolas Le Gallou David et al., "Over 10MHz Bandwidth Envelope-Tracking DC/DC converter for Flexible High Power GaN Amplifiers," Microwave Symposium Digest (MTT), Mar. 2011 IEEE MTT-S International, pp. 1-4.

\* cited by examiner

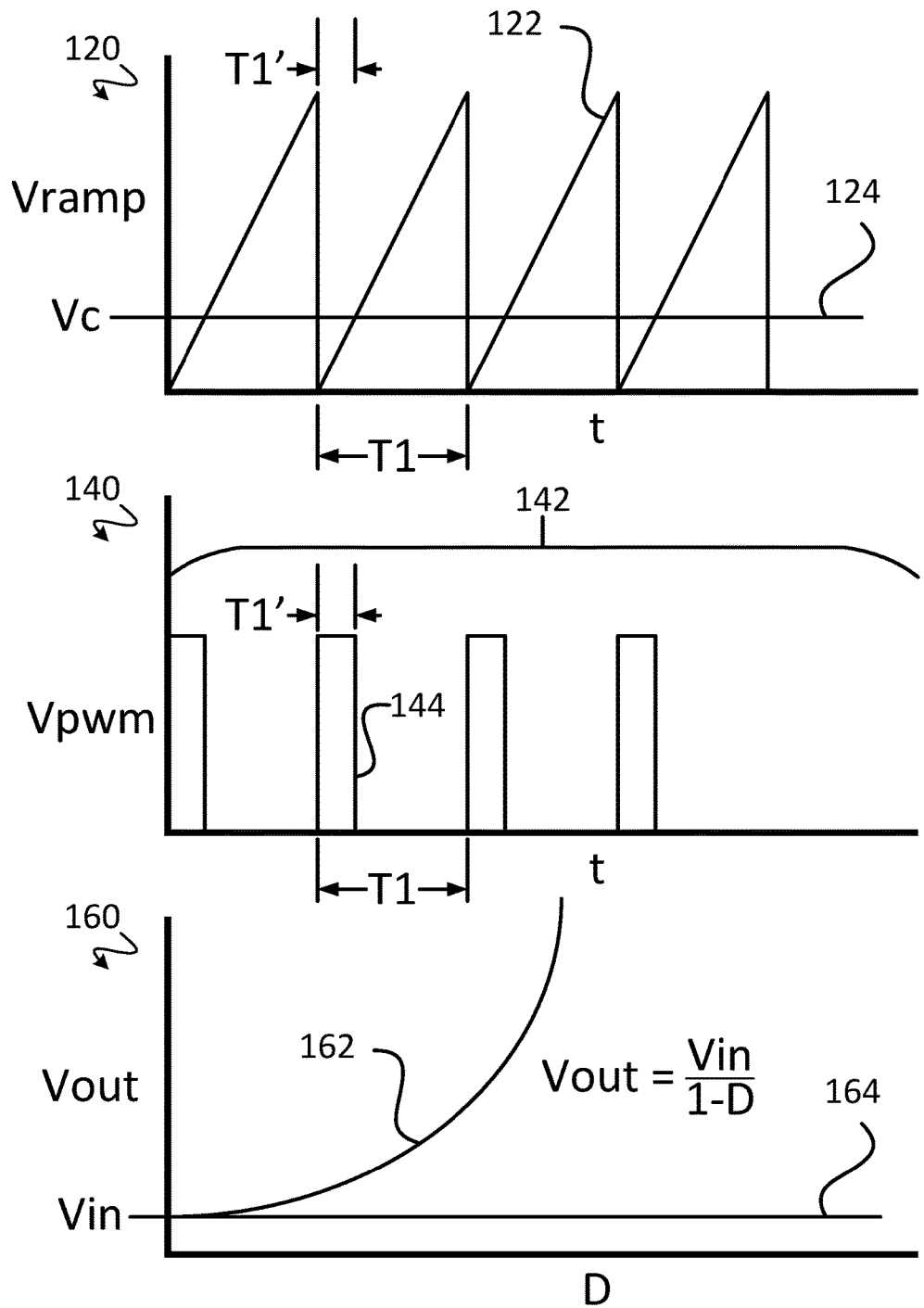

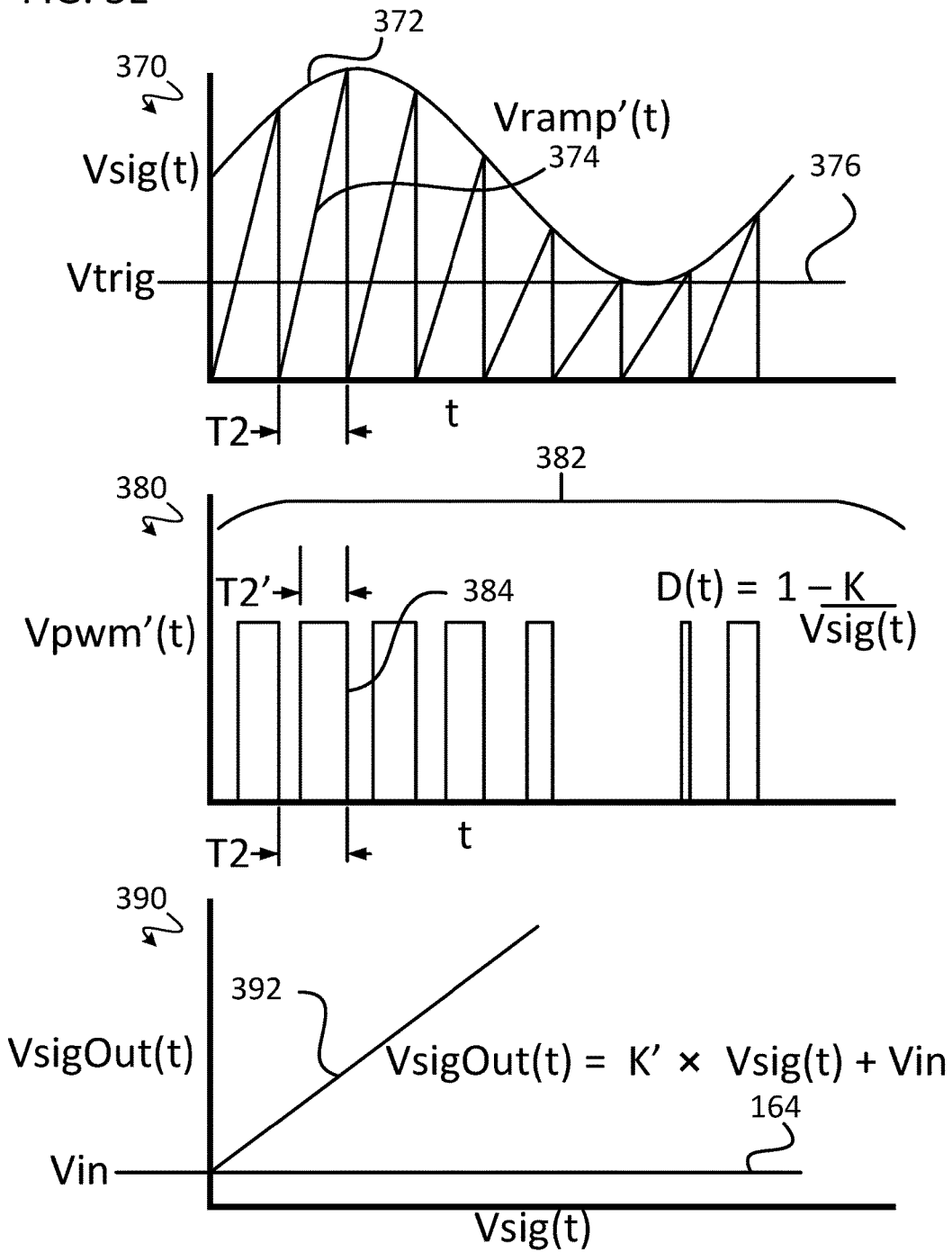

HIGH-SPEED OPEN-LOOP SWITCH-MODE BOOST CONVERTER

BACKGROUND

Some systems that amplify high-bandwidth signals use a first power converter circuit (typically a switch-mode boost power converter) to boost a DC voltage up to a fixed high-voltage rail. The fixed high-voltage rail is used as an input voltage to a second power converter circuit. The second power converter circuit is suitable for amplifying time-varying signals which have a high maximum frequency component or signal bandwidth. The second power converter is often realized as a linear power converter circuit, and in some cases, as a switch-mode buck converter circuit. In such embodiments, the second power converter circuit receives the time-varying signal and steps down the input voltage of the fixed high-voltage rail to generate an amplified form of the time-varying signal.

In instances where the second power converter circuit is a switch-mode buck converter, a time-varying output signal of the switch-mode buck converter relates linearly to the fixed input voltage of the buck converter as a function of a switching signal duty-cycle. Because of this linear relationship, the switch-mode buck converter can be implemented without a feedback loop, thereby increasing the signal bandwidth of the second power converter circuit. By contrast, the first power converter circuit, when implemented as a switch-mode boost power converter, has a non-linear relationship between its output voltage as a function of a duty-cycle of a switching signal. Because of this non-linear relationship, the typical switch-mode boost power converter circuit typically cannot be configured without a feedback loop.

SUMMARY

In some embodiments, a high-speed open-loop switch-mode boost ("open-loop") converter includes a switching signal generator circuit for generating a switching signal. The switching signal generator circuit includes a signal input node for receiving a time-varying input signal and a switching signal output node for outputting the switching signal. A duty-cycle of the switching signal has a first non-linear relationship to an amplitude of the time-varying input signal. The open-loop converter includes a switch-mode boost amplifier ("amplifier") circuit which includes an input voltage node for receiving an input voltage, a switch driver input node coupled to the switching signal output node for receiving the switching signal, and a signal output node for outputting a time-varying output signal. An amplitude of the time-varying output signal has a second non-linear relationship to the duty-cycle of the switching signal, and the time-varying output signal has a linear relationship to the time-varying input signal based on the first non-linear relationship and the second non-linear relationship. The open-loop converter also includes a filter circuit with a filter input node coupled to the signal output node of the amplifier circuit to receive the time-varying output signal and a filter output node for outputting a filtered time-varying output signal. The filter circuit is of a higher order than a second-order filter. The switching signal generator circuit is communicatively isolated from the voltage output node and the filter output node. The time-varying input signal has a first maximum frequency component, the first maximum frequency component being substantially greater than DC, and the filtered time-varying output signal has a second maximum frequency component, the second maximum frequency component being substantially the same as the first maximum frequency component.

In some embodiments, a method for amplifying a time-varying signal involves receiving a time-varying input signal at a signal input node of a switching signal generator circuit. A switching signal is generated using the switching signal generator circuit, a duty-cycle of the switching signal having a first non-linear relationship to an amplitude of the time-varying input signal. The switching signal is output from a switching signal output node of the switching signal generator circuit and received at a switch driver input node of a switch-mode boost amplifier ("amplifier") circuit. An input voltage is received at an input voltage node of the amplifier circuit. The amplifier circuit outputs a time-varying output signal from a signal output node of the amplifier circuit, an amplitude of the time-varying output signal having a second non-linear relationship to the duty-cycle of the switching signal, and the time-varying output signal having a linear relationship to the time-varying input signal based on the first non-linear relationship and the second non-linear relationship. The time-varying output signal is received from the signal output node of the amplifier circuit at a filter input node of a filter circuit, the filter circuit being of a higher order than a second-order filter. A filtered time-varying output signal is output from a filter output node of the filter circuit. The switching signal generator circuit is communicatively isolated from the voltage output node and the filter output node. The time-varying input signal has a first maximum frequency component, the first maximum frequency component being substantially greater than DC. The filtered time-varying output signal has a second maximum frequency component, the second maximum frequency component being substantially the same as the first maximum frequency component.

BRIEF DESCRIPTION OF THE DRAWINGS

FIG. 1B shows simplified signal timing diagrams associated with a prior art switch-mode boost converter.

FIG. 3E shows simplified signal timing diagrams associated with a high-speed open-loop switch-mode boost converter, in accordance with some embodiments.

DETAILED DESCRIPTION

Figure 1A:
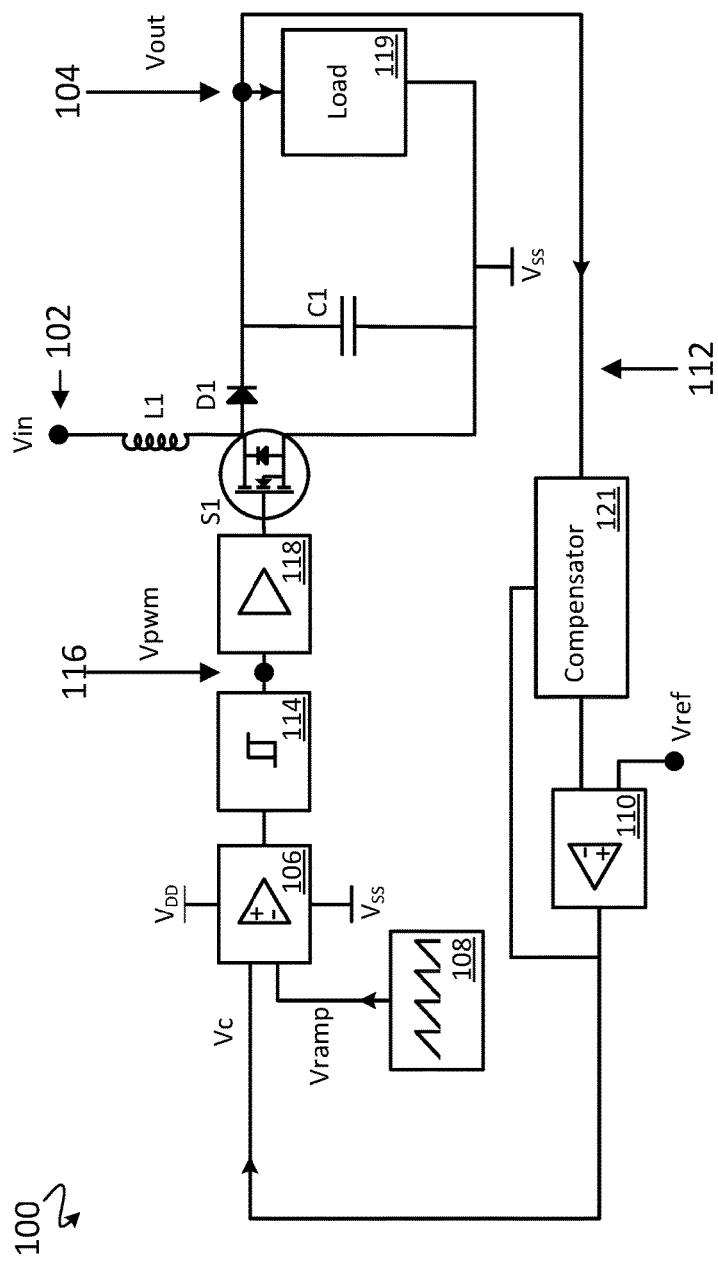
FIG. 1A is a simplified circuit diagram of a prior art switch-mode boost converter.

Some embodiments described herein provide a high-speed open-loop switch-mode boost ("open-loop") converter for amplifying a time-varying signal. In some embodiments, the open-loop boost converter receives a time-varying input signal and generates a filtered time-varying output signal that advantageously: i) has a substantially linear relationship to the time-varying input signal, and ii) has a maximum frequency component, significantly higher than DC, that is substantially the same as a maximum frequency component of the time-varying input signal (e.g., the frequency components of the input signal are reproduced in the output signal).

In some embodiments, the open-loop converter generally includes a switching signal generator circuit. The switching signal generator circuit generates a switching signal based on a time-varying input signal. A duty-cycle of the switching signal has a first non-linear relationship to the time-varying input signal. The switching signal drives a switch of a switch-mode boost converter. Based on the switching signal, the switch-mode boost converter generates a time-varying output signal. A second non-linear relationship of the switch-mode boost converter, when "counteracted" by the first non-linear relationship, results in a linear relationship between the time-varying output signal and the time-varying input signal. A high-order (e.g., greater than or equal to second-order) filter circuit coupled to an output of the switch-mode boost converter substantially passes frequency components of the time-varying input signal that are present in the time-varying output signal. The high-order filter circuit also substantially attenuates frequencies higher than maximum frequency components of the time-varying input signal that are present in the time-varying output signal. As will be discussed, such embodiments can advantageously simplify and improve the power efficiency of circuits that typically require two or more power converters, such as envelope tracking circuits used in radio frequency (RF) amplifier circuits.

Some systems that amplify a high-bandwidth signal use a first power converter circuit (typically a switch-mode boost power converter) to boost a DC voltage up to a fixed high-voltage rail. The fixed high-voltage rail is used as an input voltage Vin for a second power converter that is capable of amplifying high-bandwidth signals. Such second converters include linear power converters, and in some cases, switch-mode buck converters. The second power converter circuit receives the high-bandwidth signal and steps down the input voltage of the high-voltage rail down to generate an amplified form of the high-bandwidth signal.

In instances where the second power converter is a switch-mode buck converter, an output voltage Vout of the converter relates linearly to the input voltage Vin of the converter as a function of a converter switching duty-cycle D, the relationship being:

$$Vout = D \times Vin \qquad \text{(Equation 1).}$$

Because Vout relates linearly to Vin, the switch-mode buck converter can be configured without a feedback loop to increase the signal bandwidth of the second power converter circuit.

By contrast, the first power converter when implemented as a switch-mode boost power converter has a non-linear relationship between an output voltage Vout of the boost converter and an input voltage Vin of the boost converter as a function of switching duty-cycle D, the relationship being:

$$Vout = \frac{Vin}{1-D}. \qquad \text{(Equation 2)}$$

Because of the non-linear relationship shown in Equation 2, a typical switch-mode boost power converter circuit is typically not configured without a feedback loop.

For example, FIG. 1A shows a simplified circuit diagram of a prior art switch-mode boost power converter ("converter") 100. The converter 100 receives a fixed input voltage Vin at an input voltage node 102 and generates a boosted DC voltage Vout at an output voltage node 104 to provide power to a load 119. The converter 100 generally includes a comparator circuit 106, a ramp circuit 108, an error amplifier 110, a pulse generator circuit 114, a switch driver circuit 118, a compensator circuit 121, a switch S1, an inductor L1, an output rectifier (e.g., a diode D1), and a capacitor C1. The converter 100 also generally includes a feedback loop 112 that includes the error amplifier 110 and the compensator circuit 121.

The comparator circuit 106 receives a ramp signal Vramp from the ramp circuit 108. The comparator circuit 106 performs a comparison between the ramp signal Vramp and a control signal Vc that is received from the error amplifier 110 on the feedback loop 112. The compensator circuit 121 is coupled to the error amplifier 110. The error amplifier 110 compares a reference voltage Vref to a (typically) scaled value of the boosted voltage Vout (received from the compensator circuit 121) and amplifies an error between Vref and the scaled value of the boosted voltage Vout to generate the control signal Vc. Comparison results from the comparator circuit 106 are passed to a pulse-generator circuit 114 (e.g., a Schmitt Trigger). The pulse generator circuit 114 generates well-defined pulses based on the comparison results (e.g., pulses having a minimum pulse width and clearly defined pulse edges). These pulses form a pulse-width-modulation (PWM) signal Vpwm at signal node 116. The PWM signal Vpwm is received at a switch driver input node of the switch driver circuit 118. The switch driver circuit 118 buffers, level-shifts, or otherwise conditions the PWM signal Vpwm to make a suitable gate drive signal for turning the switch S1 on and off. When the switch S1 is on, the switch S1 conducts current from a high-side of the switch S1 to a low-side of the switch S1. In some embodiments, the switch S1 is a field-effect-transistor (FET). In some embodiments, the switch S1 is a power FET. In some embodiments, the switch S1 is an n-FET or a p-FET. The high-side of the switch S1 is coupled to the input voltage node 102 through the inductor L1. The low-side of the switch S1 is coupled to a ground node or another bias voltage (e.g., Vss). The high-side of the switch S1 is additionally coupled to the load through an output rectifier, embodied in FIG. 1A as the diode D1. The capacitor C1 couples the output voltage node 104 to the ground or other bias voltage node. The capacitor C1 typically filters out non-DC frequency components of the boosted voltage Vout (e.g., passes DC and substantially blocks non-DC frequencies). The boosted voltage Vout is received at the load 119.

As was discussed with reference to Equation 2, Vout relates non-linearly to Vin as a function of a duty-cycle D of the PWM signal Vpwm. However, because the feedback loop 112 continually adjusts the PWM signal Vpwm to minimize a difference between the scaled value of the boosted voltage Vout and the reference voltage Vref, the boosted voltage Vout will ideally converge to a desired voltage value that is linearly proportional to the reference voltage Vref. However, circuit elements of the feedback loop 112, including the compensator circuit 121 and the error amplifier 110, slow down the response time of the feedback loop 112. This slowed response time limits the maximum frequency at which Vc and/or Vin can change in amplitude and the converter 100 can still reproduce a corresponding (though scaled) amplitude change in the boosted voltage Vout. Thus, the feedback loop 112 is said to limit the bandwidth of the converter 100.

A simplified signal timing diagram 120 of FIG. 1B shows a ramp signal Vramp 122 and a control signal Vc 124 received at the comparator circuit 106 of FIG. 1A over time t. A simplified signal timing diagram 140 of FIG. 1B shows a PWM signal Vpwm 142 generated from the ramp signal Vramp 122 and the control signal Vc 124 via the comparator circuit 106 and the pulse generator circuit 114. In the example shown, the control signal Vc 124 is shown as constant over time t for simplicity. However, it is understood that the control signal Vc 124 can change over time.

The ramp signal Vramp 122, and by extension the PWM signal Vpwm 142, are shown to have a period T1. A duration of time that the ramp signal Vramp 122 is below the control signal Vc 124 is designated as duration T1'. The comparator circuit 106 of FIG. 1A outputs a comparison value that is positive when the control signal Vc 124 is greater than the ramp signal Vramp 122 and negative (or zero) when the control signal Vc 124 is less than the ramp signal Vramp 122. The pulse generator circuit 114 receives the comparison value and generates pulses (e.g., 144) based on the received comparison value. Accordingly, a pulse width of the pulse 144 is also of duration T1'. The ratio of the pulse duration T1' to the period T1 is the duty-cycle D of the PWM signal Vpwm 142 for that period. As shown in Equation 2, for a fixed input voltage Vin, the boosted output voltage Vout increases and decreases non-linearly as the duty-cycle D increases and decreases, respectively. This non-linear relationship is illustrated in a simplified signal timing diagram 160 of FIG. 1B. As shown, the boosted output voltage Vout 162 is a non-linear function of duty-cycle D of the PWM signal Vpwm 142 for a fixed input voltage Vin 164. Because of this non-linearity, switch-mode boost power converters typically require the use of a feedback loop when used as signal or voltage amplifiers. However, as mentioned earlier, the feedback loop 112 limits an upper signal bandwidth that can be reproduced by the converter 100.

Figure 2A:
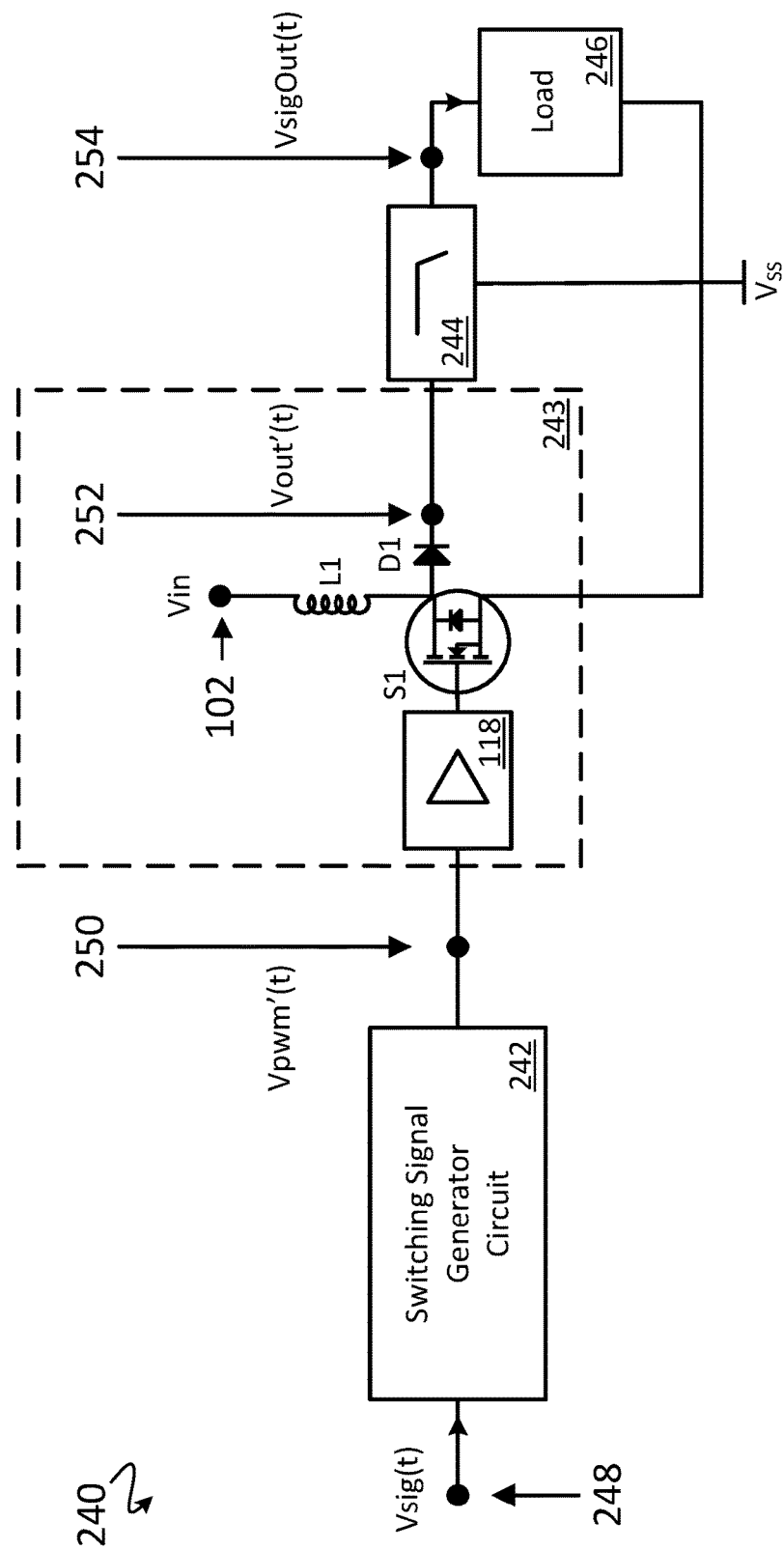
FIG. 2A-B are simplified circuit diagrams of high-speed open-loop switch-mode boost converters, in accordance with some embodiments.

FIG. 2A illustrates a simplified circuit diagram of a high-speed open-loop switch-mode boost converter ("open-loop converter") 240 with linear signal characteristics, in accordance with some embodiments. Like-numbered elements of the open-loop converter 240 may have similar descriptions as corresponding like-numbered elements of the converter 100 of FIG. 1A, although design considerations may cause actual implementations of these elements to be rendered differently in the two circuits. In general, the open-loop converter 240 includes a switching signal generator circuit 242, a switch-mode boost amplifier ("amplifier") circuit portion 243, and a filter circuit 244 to provide power to a load 246. The amplifier circuit portion 243 generally includes the input voltage node 102, the switch driver circuit 118, the switch S1, the inductor L1, a signal output node 252, and an output rectifier realized here as the diode D1. Some elements of the open-loop converter 240 have been omitted from FIG. 2A to simplify the description of the open-loop converter 240 but are understood to be present. In some embodiments, the switch driver circuit 118 is part of the switching signal generator circuit 242.

The open-loop converter 240 receives a time-varying input signal Vsig(t) at a signal input node 248 and generates a switching signal Vpwm'(t) at an output node 250. A duty-cycle of the switching signal Vpwm'(t) has a non-linear relationship to an amplitude of the time-varying input signal Vsig(t). In some embodiments, the relationship of amplitude to duty-cycle is described as:

$$D(t) = 1 - \frac{K}{Vsig(t)}, \quad \text{(Equation 3)}$$

where D(t) is a duty-cycle of the switching signal Vpwm'(t) that varies over time t in accordance with an amplitude of the time-varying input signal Vsig(t), and K is a constant. The time-varying input signal Vsig(t) is a signal that has rising and falling amplitudes, which vary over time, resulting in frequency components that are substantially greater than DC. In some embodiments a signal bandwidth $Vsig_{BW}$, or a maximum frequency component fMAX(Vsig(t)), of the time-varying input signal Vsig(t) is 20 Hz-20 kHz; in some embodiments the signal bandwidth $Vsig_{BW}$ or the maximum frequency component fMAX(Vsig(t)) is greater than 1 MHz, greater than 10 MHz, and in some embodiments, is on the order of 100 MHz. In some embodiments, the time-varying input signal Vsig(t) is a sinusoid. In some embodiments, the time-varying input signal Vsig(t) is a modulated sinusoid. In some embodiments, the time-varying input signal Vsig(t) is a signal having a time-varying amplitude having a frequency content up to and including fMAX(Vsig(t)). In some embodiments, the time-varying input signal Vsig(t) is an audio signal. In some embodiments, the time-varying input signal Vsig(t) is an envelope signal. In some embodiments, the time-varying input signal Vsig(t) is a communication signal, or another signal suitable for amplification.

The switch driver circuit 118 receives the switching signal Vpwm'(t) at a switch driver input node and generates a suitable gate driver signal (as described with reference to FIG. 1A) for turning the switch S1 on and off in accordance with Vpwm'(t) to generate a boosted time-varying output signal Vout'(t) at the signal output node 252. The time-varying output signal Vout'(t) has a non-linear relationship to the duty-cycle D(t) of the switching signal Vpwm'(t) (similar to that of Equation 2), expressed here as:

$$Vout'(t) = \frac{Vin}{1 - D(t)}. \quad \text{(Equation 4)}$$

Thus, by substituting the first non-linear relationship for duty-cycle D(t) as shown in Equation 3 into the second non-linear relationship for the time-varying output signal Vout'(t) of Equation 4, it is shown that a linear relationship between the time-varying input signal Vsig(t), the time-varying output signal Vout'(t), and a filtered time-varying output signal VsigOut(t) is achieved. This linear relationship can be expressed as:

$$V\text{sigOut}(t) = K' \times V\text{sig}(t) + V\text{in} \quad \text{(Equation 5)},$$

where constant K' includes the constant K and the constant input voltage Vin.

The filter circuit 244 receives the time-varying output signal Vout'(t) at the signal output node 252 and substantially filters out frequency components that are greater than the signal bandwidth $V\text{sig}_{BW}$, or a maximum frequency component fMAX(Vsig(t)), of the time-varying input signal Vsig(t) (e.g., switching frequencies and harmonics thereof). The filter circuit 244 outputs the filtered time-varying output signal VsigOut(t) at a signal output node 254. The filtered time-varying output signal VsigOut(t) is received at the load 246. The filtered time-varying output signal VsigOut(t) advantageously has a signal bandwidth that is substantially the same as the signal bandwidth of the input signal Vsig(t) and has a maximum frequency component fMAX(VsigOut (t)) that is the same as a maximum frequency component fMAX(Vsig(t)) of the time-varying input signal Vsig(t). That is, Vsig(t) and VsigOut(t) both includes a range of frequency components, ranging from a minimum frequency component to a maximum frequency component, the ranges being substantially the same. This contrasts with the converter 100, which due to the capacitor C1, substantially filters out non-DC frequency components of Vout (e.g., switching frequencies).

Because the open-loop converter 240 does not have a feedback loop (e.g., the feedback loop 112 of FIG. 1A), the open-loop converter 240 is said to be communicatively isolated from the signal output nodes 252, 254. Two or more circuit nodes that are communicatively isolated do not receive significant current, voltage, or representations of current and voltage (e.g., via galvanic isolation, optical isolation, or digital values) between the two or more circuit nodes. However, it is understood that there may be some insignificant current or voltage shared between the two nodes due to undesired inductive coupling, ground loops, or other non-idealities. This absence of a feedback loop advantageously enables the open-loop converter 240 to amplify signals having a significantly higher bandwidth than the converter 100 can amplify.

In some embodiments, at least the switching signal generator circuit 242, the switch driver circuit 118, and the switch S1 are integrated into a signal integrated circuit (IC) package. In some embodiments, an IC package includes a semiconductor device that integrates multiple circuit elements of the open-loop converter 240. In some embodiments, the semiconductor device includes a substrate and an active layer formed on a monolithic substrate. The active layer includes all or part of the switching signal generator circuit 242, all or part of the switch driver circuit 118, and includes the switch S1. In some embodiments, the active layer is formed using silicon (Si). In some embodiments, the active layer is formed using silicon carbide (SiC). In other embodiments, the active layer is formed using other materials known in the art.

Figure 2B:
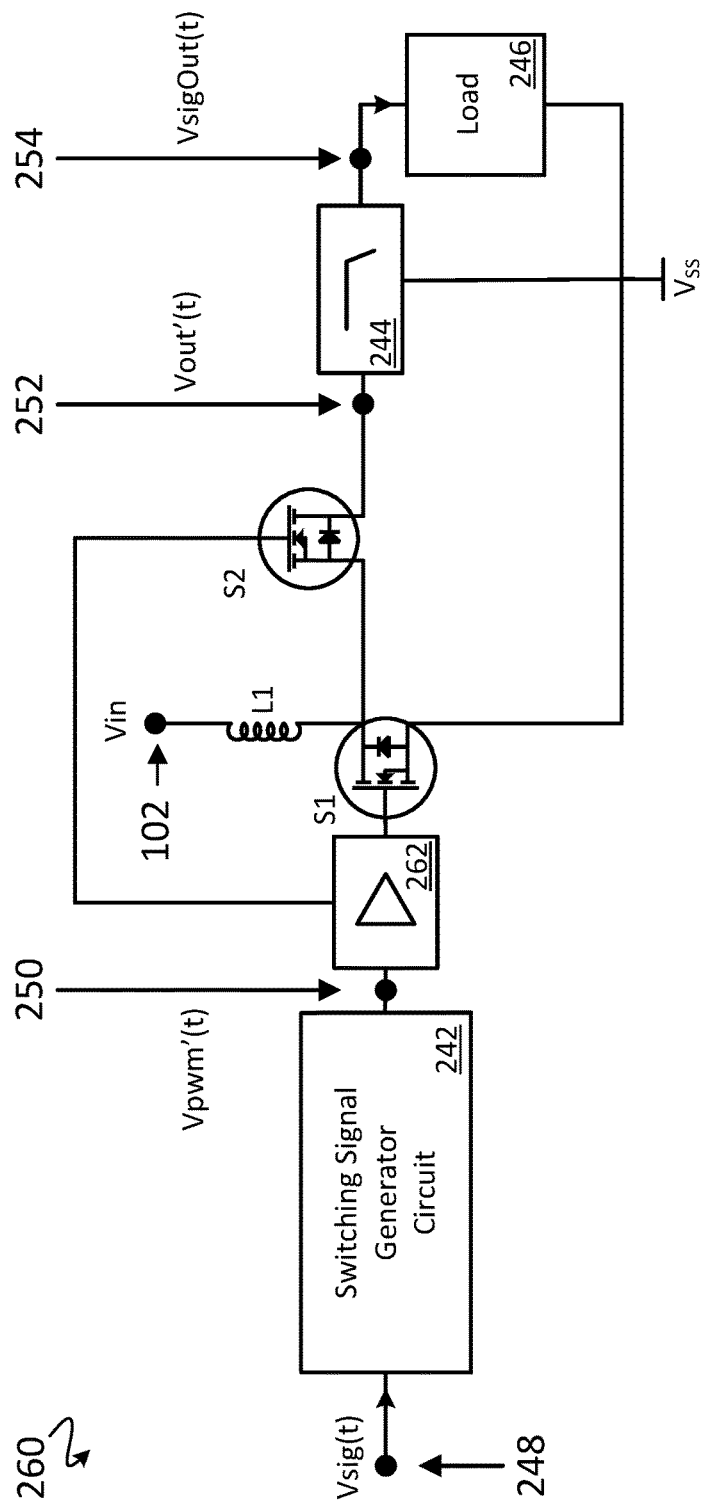

FIG. 2B illustrates a simplified circuit diagram of a high-speed, open-loop switch-mode boost converter ("open-loop converter") 260 with linear signal characteristics, in accordance with some embodiments where a synchronous switch S2 is used as the output rectifier in lieu of the diode D1. The open-loop converter 260 generally includes like-numbered elements as shown and described with reference to FIG. 2A. A switch driver circuit 262 is shown to have a second signal output coupled to a gate node of the switch S2 to, in general, synchronously turn the switch S2 on when the switch S1 is turned off and turn the switch S2 off when the switch S1 is turned on. As is known in the art, replacing a diode output rectifier with a synchronously switched output rectifier can increase system efficiency.

Figure 3A:
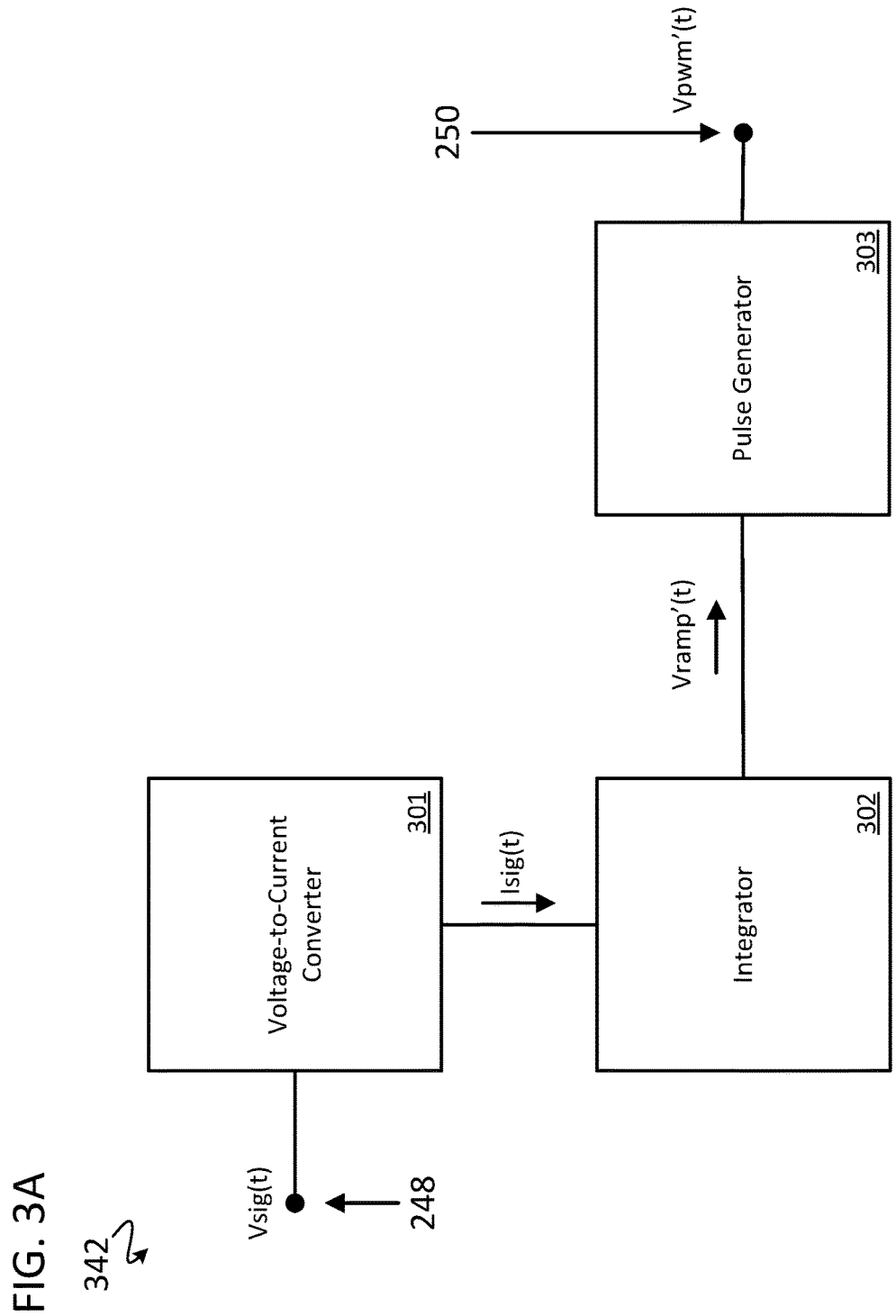
FIG. 3A-D are simplified circuit diagrams providing details of switching signal generator circuits of a high-speed open-loop switch-mode boost converter, in accordance with some embodiments.

FIG. 3A illustrates a simplified circuit diagram of an example embodiment of a switching signal generator circuit 342, in accordance with some embodiments. In some embodiments, the switching signal generator circuit 242 shown in FIG. 2A and/or FIG. 2B is realized as the switching signal generator circuit 342. In general, the switching signal generator circuit 342 generates a time-varying ramp signal Vramp'(t) which is used to generate the switching signal Vpwm'(t). The ramp signal Vramp'(t) relates non-linearly to Vsig(t). At a high-level, the switching signal generator circuit 342 includes a voltage-to-current conversion circuit portion 301, an integrator circuit portion 302, and a pulse generation circuit portion 303. These circuit portions 301, 302, 303, given the time-varying input signal Vsig(t) received from the signal input node 248, generate the switching signal Vpwm'(t) having a duty-cycle D(t) in accordance to Equation 3. In other embodiments, the switching signal generator circuit 242/342 includes other circuit portions suitable for generating the switching signal Vpwm' (t) having a duty-cycle D(t) in accordance with Equation 3.

Figure 3B:
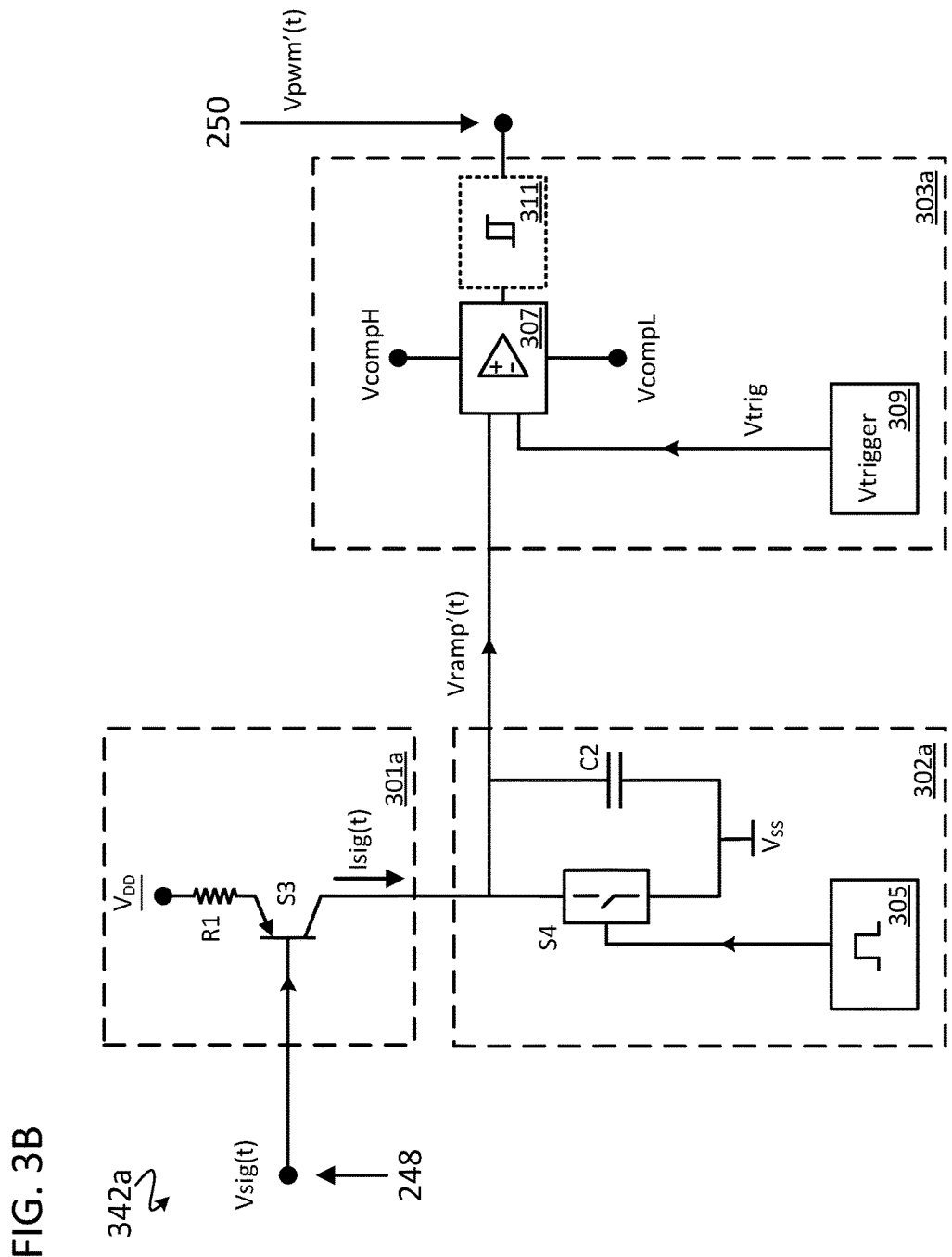

FIG. 3B illustrates a simplified circuit diagram of an example embodiment of a switching signal generator circuit 342a, in accordance with some embodiments. In some embodiments, the switching signal generator circuit 242 shown in FIG. 2A and/or FIG. 2B is realized as the switching signal generator circuit 342a. In the example embodiment shown, the switching signal generator circuit 342a includes a voltage-to-current conversion circuit portion 301a, an integrator circuit portion 302a, and a pulse generation circuit portion 303a. These circuit portions 301a, 302a, 303a, given the time-varying input signal Vsig(t) received from the signal input node 248, generate the switching signal Vpwm' (t) having a duty-cycle D(t) in accordance to Equation 3.

In the embodiment shown, the example voltage-to-current conversion circuit portion 301a generally includes a switch S3 coupled to a positive voltage node Vdd through a resistor R1. In some embodiments, the switch S3 is a field-effect-transistor (FET). In some embodiments, the switch S3 is an n-FET, a p-FET or a bi-polar junction transistor (BJT). Other voltage-to-current conversion circuit portions suitable for generating a time-varying current based on a received time-varying voltage signal, a time varying digital signal, or a static digital signal, as are known in the art, could be used for the voltage-to-current conversion portions described herein.

The integrator circuit portion 302a generally includes a capacitor C2 coupled between the voltage-to-current conversion portion 301a and a ground node (or another bias voltage Vss), a switch S4 coupled in parallel to the capacitor C2, and a switch control circuit 305 coupled to a switch control node of the switch S4.

The pulse generation circuit portion 303a generally includes a comparator circuit 307 (which is similar to the comparator circuit 106) with a first input coupled to the capacitor C2 and a second input coupled to a trigger level generation circuit 309 and powered between a high voltage rail VcompH and a low voltage rail VcompL. An output of the comparator circuit 307 is coupled to an input of a pulse-generator circuit 311 (which is similar to the pulse-generator circuit 114). In some embodiments, the high voltage rail VcompH is Vdd and the low voltage rail VcompL is the ground node (or the other bias voltage Vss). In some embodiments, the comparator circuit 307 is suitable for generating well-defined pulses and the pulse-generator circuit 311 is optional. In some embodiments, the bias voltage node Vss is a ground node. In some embodiments, the bias voltage node Vss is another bias voltage.

When driven by the time-varying input signal Vsig(t), the switch S3 provides a proportional time-varying current Isig(t) to the integrator circuit portion 302a. In the embodiment shown, an amplitude of the time-varying current Isig(t) is 180 degrees out of phase with the time-varying input signal Vsig(t). In other embodiments (e.g., as shown in FIG. 3D), the time-varying current Isig(t) is in phase with the time-varying input signal Vsig(t). A ramp signal Vramp'(t) is generated by the integrator circuit portion 302a. The time-varying current Isig(t) charges the capacitor C2 of the integrator circuit portion 302a; and the switch S4, when triggered by the switch control circuit 305, discharges the capacitor C2 through the switch S4 to the ground voltage node. A value of the capacitor C2 and a switch rate of the switch S4 are chosen for a corresponding voltage-to-current conversion circuit portion 301a such that a frequency of the resultant ramp signal Vramp'(t) is at least two times greater than a maximum frequency of the time-varying input signal Vsig(t). The frequency of the ramp signal Vramp'(t) can be selected at design time through the realization of the voltage-to-current conversion circuit portion 301a, a chosen capacitance value of the capacitor C2, a discharge rate/period of the switch S4 as driven by the switch control circuit 305, and a discharge duty-cycle of the switch S4 as driven by the switch control circuit 305. In some embodiments, the discharge period of the switch S4 is set to be equal to or greater than a time duration to fully discharge the capacitor C2 to the ground node when the switch S4 is conducting. In the example shown in FIG. 3B, amplitudes of the time-varying input signal Vsig(t) are 180-degrees out of phase with corresponding amplitudes of a generated ramp signal Vramp'(t). That is, the integrator circuit portion 302a as shown generates a ramp signal Vramp'(t) having maximum ramp peak amplitudes that correspond to minimum amplitudes of the time-varying input signal Vsig(t) and minimum ramp peak amplitudes that correspond to maximum amplitudes of the time-varying input signal Vsig(t).

The comparator circuit 307 receives the ramp signal Vramp'(t) at a first input and compares amplitudes of the ramp signal Vramp'(t) to an amplitude of a trigger voltage Vtrig received from the trigger level generation circuit (Vtrigger) 309. Comparison results from the comparator circuit 307 are passed to the pulse-generator circuit 311. The pulse generator circuit 311 generates well-defined pulses based on the comparison results. These pulses form the switching signal Vpwm'(t) at the output node 250.

In some embodiments, elements of the circuit portions 301a, 302a are selected to generate a Vramp'(t) signal having a maximum ramp peak amplitude that is equal to, or slightly less, than the high voltage rail VcompH of the comparator circuit 307 and a minimum ramp peak amplitude that is equal to, or slightly greater, than the low voltage rail VcompL of the comparator circuit 307. In some embodiments, the amplitude of the trigger voltage Vtrig is set at design time to be greater than zero and less than or equal to a minimum ramp peak amplitude of the ramp signal Vramp'(t). In some embodiments, the trigger voltage Vtrig is set to be a fixed percentage of a voltage rail of the comparator circuit 307. In other embodiments, such as one shown in FIG. 3C, an amplitude of the trigger voltage Vtrig is determined during operation of the open-loop converter 240/260.

Figure 3C:
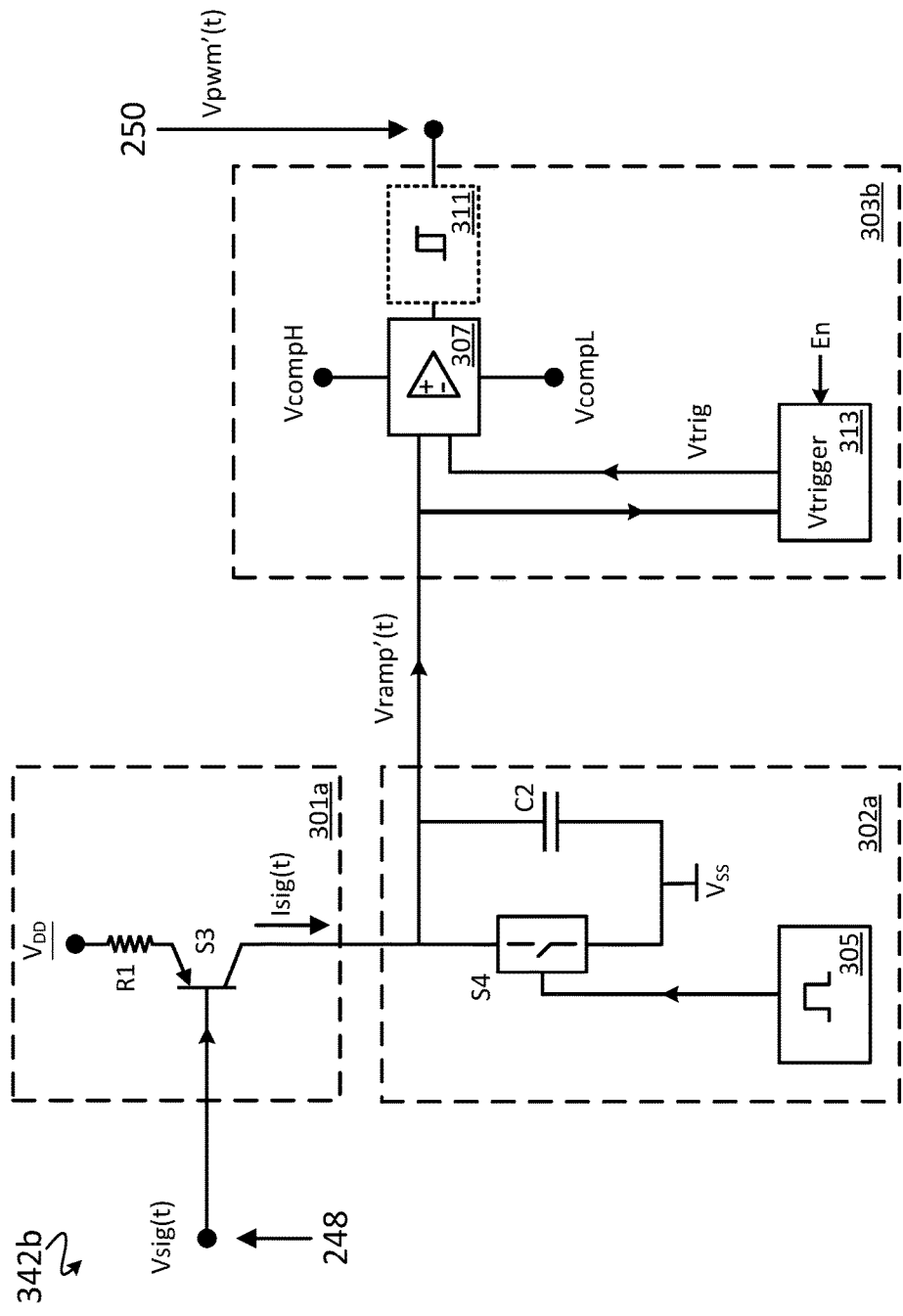
Figure 3D:
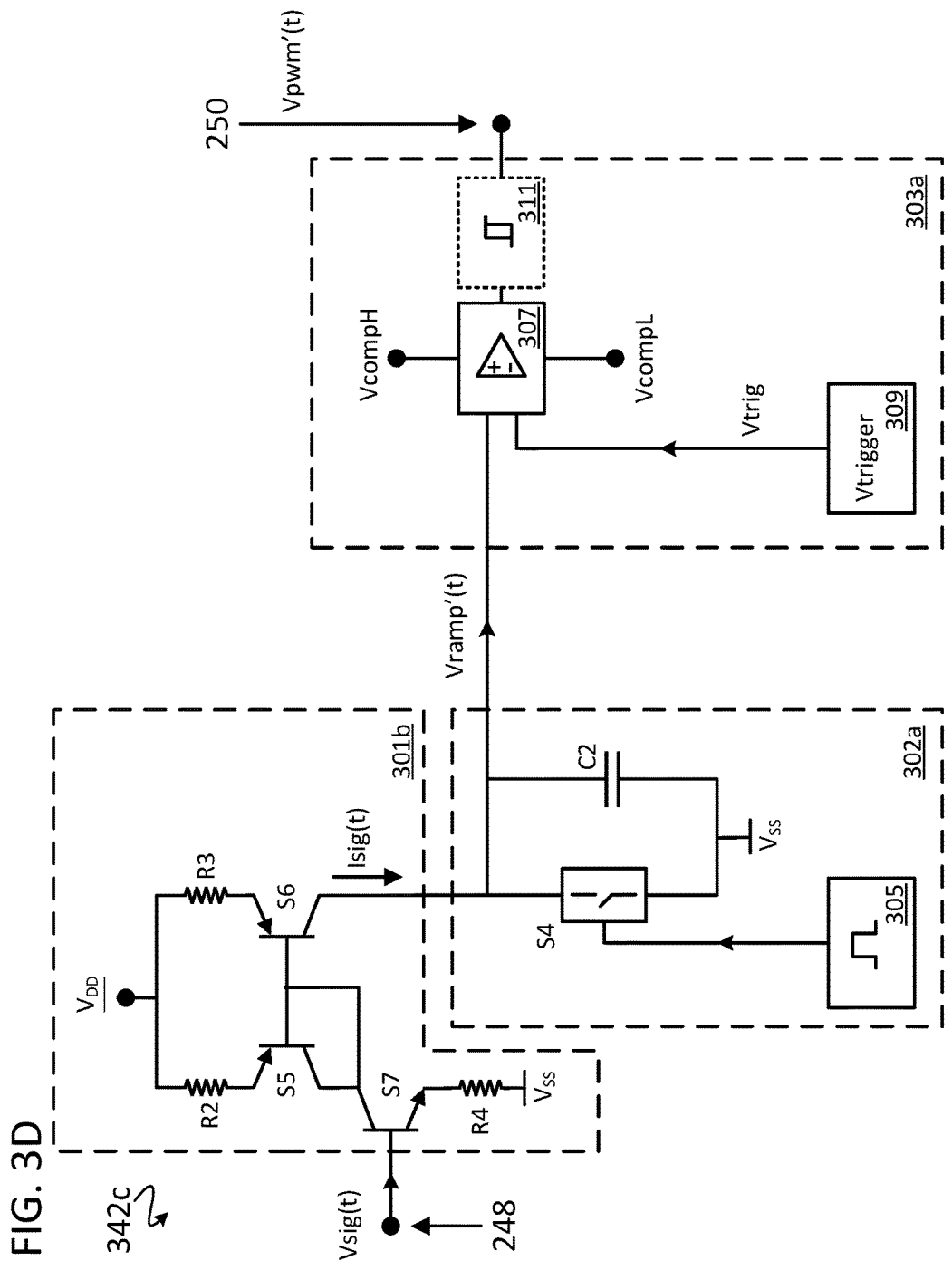

FIG. 3C illustrates a simplified circuit diagram of an example embodiment of a switching signal generator circuit 342b, in accordance with some embodiments. In some embodiments, the switching signal generator circuit 242 shown in FIG. 2A/2B is realized as the switching signal generator circuit 342b. The switching signal generator circuit 342b generally includes the voltage-to-current conversion circuit portion 301a, the integrator circuit portion 302a, and a pulse generation circuit portion 303b. Like-numbered circuit elements correspond to like-numbered circuit elements shown and discussed with reference to FIG. 3B. In the embodiment shown, a trigger level generation circuit (Vtrigger) 313 is coupled to the capacitor C2 to receive the ramp signal Vramp'(t). The trigger level generation circuit 313 detects a minimum ramp peak voltage amplitude and generates a trigger voltage Vtrig having an amplitude that is greater than zero and equal to, or less than, the detected minimum ramp peak voltage amplitude. Thus, rather than being set to an arbitrary amplitude, or the amplitude being set at design time, the amplitude of the trigger voltage Vtrig advantageously corresponds to a specific amplitude of the ramp signal Vramp'(t). In some embodiments, the detection occurs when an external control signal En is received by the trigger level generation circuit 313 (e.g., from a control circuit or a reset control circuit, not shown).

FIG. 3D illustrates a simplified circuit diagram of an example embodiment of a switching signal generator circuit 342c, in accordance with some embodiments. In some embodiments, the switching signal generator circuit 242 shown in FIG. 2A/2B is realized as the switching signal generator circuit 342c. The switching signal generator circuit 342c generally includes a voltage-to-current conversion circuit portions 301b, the integrator circuit portion 302a, and the pulse generation circuit portion 303a (or the pulse generation circuit portion 303b shown in FIG. 3C) Like-numbered circuit elements correspond to like-numbered circuit elements shown and discussed with reference to FIG. 3B. In the embodiment shown, the voltage-to-current conversion circuit portion 301b is realized using a current-mirror topology, the circuit portion 301b generally including resistors R2-4 and switches S5-7, coupled as shown. In some embodiments, any of the switches S5-S7 can be an n-FET, a p-FET, an n-type power FET, a BJT, or a p-type power FET.

In the example shown, amplitudes of the time-varying input signal Vsig(t) are in phase with corresponding amplitudes of the generated ramp signal Vramp'(t). That is, the integrator circuit portion 302a generates a ramp signal Vramp'(t) having maximum ramp peak amplitudes that correspond to maximum amplitudes of the time-varying input signal Vsig(t) and minimum ramp peak amplitudes that correspond to minimum amplitudes of the time-varying input signal Vsig(t).

This correspondence is further illustrated in simplified signal timing diagram 370 FIG. 3E, which shows a ramp signal Vramp'(t) 374 and a trigger voltage Vtrig 376 received at the comparator circuit 307 (of FIG. 3D) over time t. The ramp signal Vramp'(t) 374 is generated based on a time-varying input signal Vsig(t) 372 received at the signal input node 248. In the example shown, maximum peak amplitudes of the ramp signal Vramp'(t) 374 correspond to maximum amplitudes of the time-varying input signal Vsig(t) 372. Minimum peak amplitudes of the ramp signal Vramp'(t) 374 correspond to minimum amplitudes of the time-varying input signal Vsig(t) 372. Thus, Vsig(t) 372 and Vramp'(t) 374 are in phase. As shown, an amplitude of the trigger voltage Vtrig 376 is equal to or less than a minimum peak amplitude of the ramp signal Vramp'(t) 374. In some embodiments, as was discussed with reference to FIG. 3B, the amplitude of the trigger voltage Vtrig 376 is set at design time. In other embodiments, as was discussed with reference to FIG. 3C, the amplitude of the trigger voltage Vtrig 376 is set based a determination of a minimum generated peak amplitude of the ramp signal Vramp'(t) 374.

A simplified signal timing diagram 380 of FIG. 3E shows a switching signal Vpwm'(t) 382 that corresponds to the relationship between the ramp signal Vramp'(t) 374 and the trigger voltage Vtrig 376. In contrast to the control signal Vc 124 as described with reference to FIG. 1B, the trigger voltage Vtrig 376 does not change over time t. However, in embodiments similar to that of FIG. 3C, a new amplitude of trigger voltage Vtrig can be generated if the enable signal En is triggered again. The ramp signal Vramp'(t) 374, and by extension the switching signal Vpwm'(t) 382, are shown to have a period T2. An example duration of time that the ramp signal Vramp'(t) 374 is greater than the trigger voltage Vtrig 376 is designated as duration T2'. The comparator circuit 307, in some embodiments, outputs a positive value when an amplitude of the ramp signal Vramp'(t) 374 is greater than the trigger voltage Vtrig 376. The pulse generator circuit 311 receives the comparison value and generates pulses (e.g., 384) based on the received comparison value. Accordingly, a pulse width of the pulse 384 is also of duration T2'. The ratio of the pulse duration T2' to the period T2 is the duty-cycle D(t) of the switching signal Vpwm'(t) for that period. This time-varying duty-cycle D(t) of the switching signal Vramp'(t) is in accordance with Equation 3.

As shown in the simplified timing diagram 390 of FIG. 3E, by substituting the first non-linear relationship for duty-cycle D(t) as shown in Equation 3 into the second non-linear relationship for the time-varying output signal Vout'(t) of Equation 4, it is shown that a linear relationship 392 between the time-varying input signal Vsig(t) and the time-varying output signal VsigOut(t) is achieved.

In some embodiments, the period T2 of the ramp signal Vramp'(t) is selected such that a frequency of the ramp signal Vramp'(t) is two or more times greater than one or both of a maximum frequency component fMAX(Vsig(t)) or signal bandwidth VsigBW of the time-varying input signal Vsig(t). In some embodiments, the period T2 of the ramp signal Vramp'(t) is selected such that a frequency of the ramp signal Vramp'(t) is eight or more times greater than one or both of the maximum frequency component fMAX(Vsig(t)) or signal bandwidth VsigBW of the time-varying input signal Vsig(t).

Figure 4A:
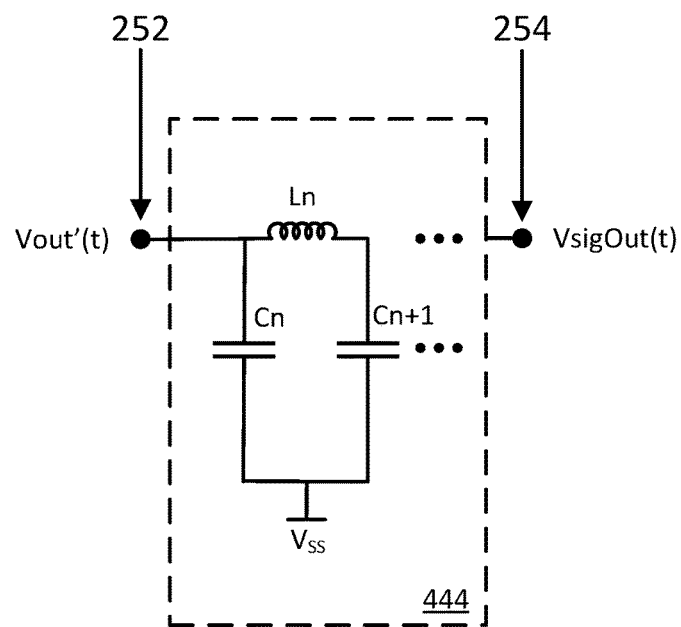
FIG. 4A is a simplified circuit diagram providing details of a filter circuit of a high-speed open-loop switch-mode boost converter, in accordance with some embodiments.
Figure 4B:
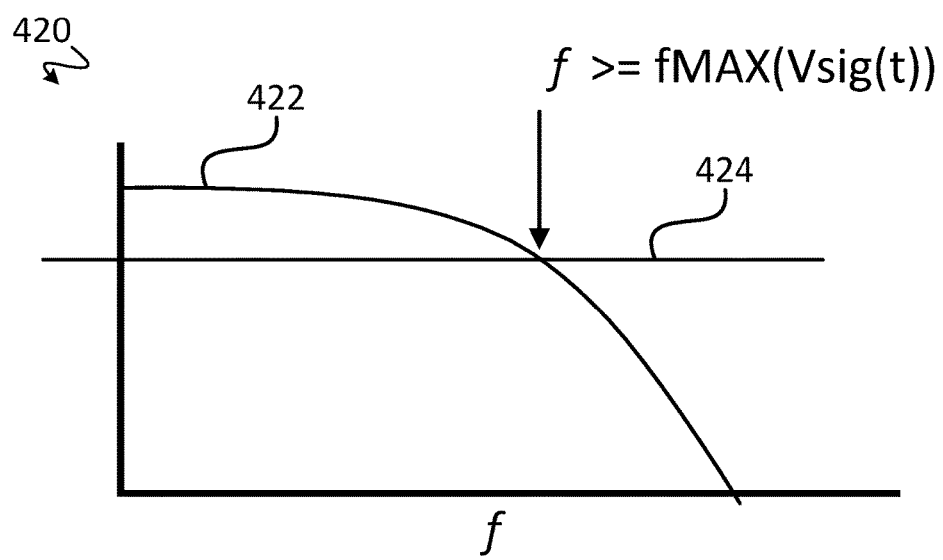
FIG. 4B is a simplified transfer function of a filter circuit of a high-speed open-loop switch-mode boost converter, in accordance with some embodiments.

FIG. 4A illustrates a simplified circuit diagram of an example embodiment of a filter circuit 444 of the open-loop converter 240/260, in accordance with some embodiments. In some embodiments, the filter circuit 244 of FIG. 2A/2B is realized as the filter circuit 444. In the embodiment shown, the filter circuit 444 is realized as an N-pole PI filter. The filter circuit 444 receives the time varying output signal Vout'(t) at the signal output node 252 and outputs the filtered time-varying output signal VsigOut(t) at the signal output node 254. The order of the filter circuit 444 is higher than a second-order filter. That is, the filter circuit 444 is not realized as a first-order filter, such as an RC or RL filter, or as a second-order filter, such as an RLC filter. The filter circuit 444 generally includes N cascaded filter sections, each generally including an inductor Ln, a capacitor Cn, and a capacitor Cn+1, coupled as shown. In some embodiments, the filter circuit 444 is implemented as one of a Chebyshev filter circuit, a Butterworth filter circuit, an Elliptic filter circuit, a Bessel filter circuit, an active filter circuit (e.g., using one or more op-amps), a digital filter circuit (e.g., using a digital-signal-processor), or another filter circuit that is suitable for substantially passing frequencies that are equal to or less than the maximum frequency component fMAX(Vsig(t)) of the time-varying input signal Vsig(t) and substantially attenuating frequencies that are greater than the maximum frequency component fMAX(Vsig(t)) of the time-varying input signal Vsig(t), where fMAX(Vsig(t)) is substantially greater than DC. In some embodiments, the filter circuit 444 has a 3 dB cutoff frequency that is greater than the maximum frequency component fMAX(Vsig(t)) of the time-varying input signal Vsig(t), as illustrated in the simplified timing diagram 420 of FIG. 4B. Simplified diagram 420 shows an example transfer function 422 of the filter circuit 244/444 having a 3 db cutoff 424 at a frequency f that is greater than or equal to the maximum frequency component fMAX(Vsig(t)) of the time-varying input signal Vsig(t). Aspects of the transfer function such as passband/stopband ripple (when present) have been omitted for simplicity. In some embodiments, roll-off of the filter circuit 244/444 may be significantly steeper than illustrated.

Figure 5:
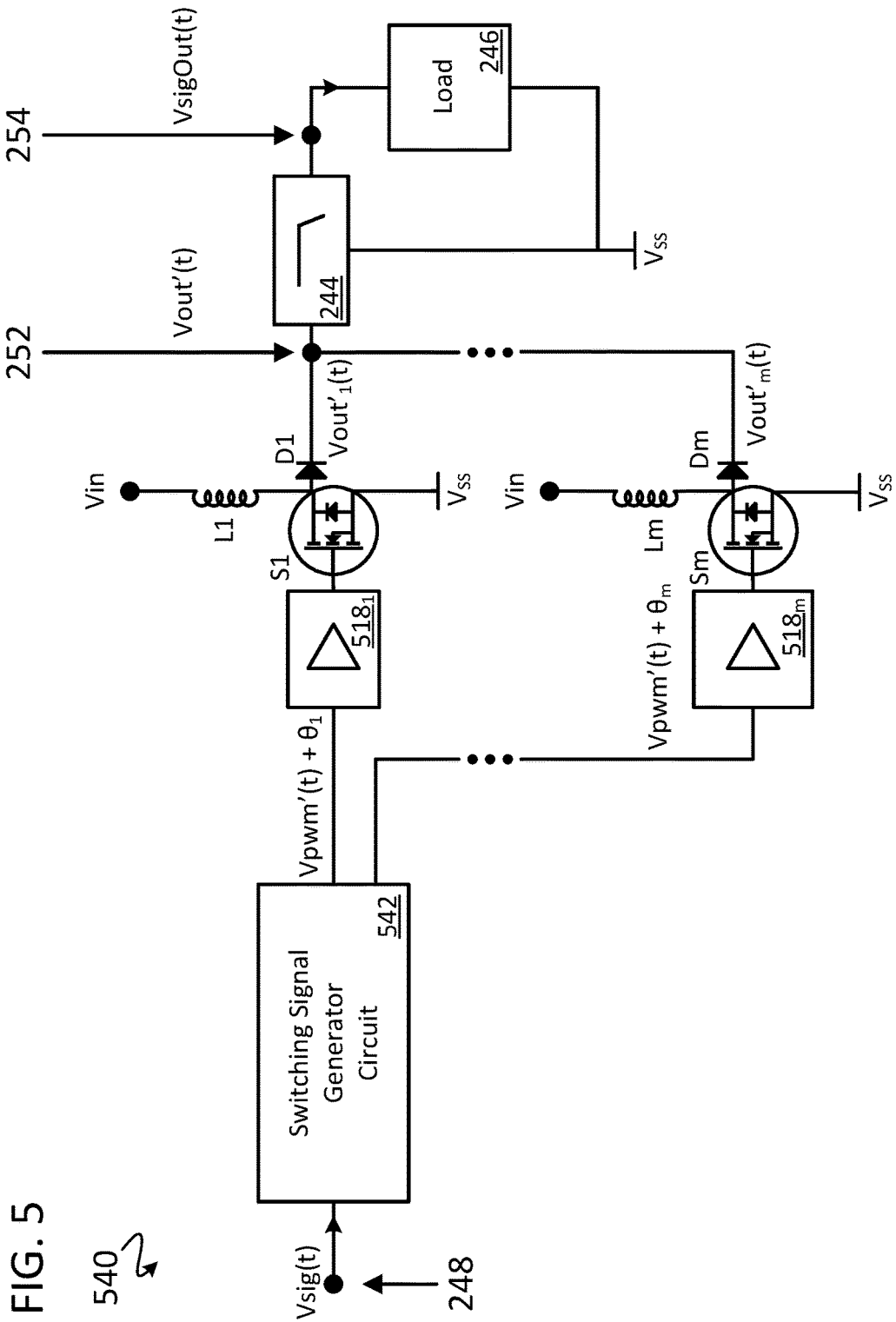
FIG. 5 is a simplified circuit diagram of a multi-phase open-loop switch-mode boost converter, in accordance with some embodiments.

FIG. 5 illustrates a simplified circuit diagram of a multi-phase high-speed open-loop switch-mode boost converter ("open-loop converter") 540 with linear signal characteristics, in accordance with some embodiments. Like numbered elements of the open-loop converter 540 may have similar descriptions as corresponding like-numbered elements of the converter 100 of FIG. 1A and the open-loop converter 240/260, although design considerations may cause actual implementations of these elements to be rendered differently in the different circuits. In general, the open-loop converter 540 includes m switch-mode boost amplifier sections, each of which generally includes a respective inductor of the inductors L1-$m$, a switch of the switches S1-$m$ and a synchronous or passive output rectifier, shown here as diodes D1-$m$. A switching signal generator circuit 542, similar to the switching signal generator circuit 242, outputs m copies of the switching signal Vpwm'(t), each copy of which is separated by a respective phase offset $\theta_1$-$\theta_m$. The m copies of the switching signal Vpwm'(t), with varying phase offsets, are received by m respective switch driver circuits 518$_{1-m}$. The m switch-mode boost amplifier sections generate m time-varying output signals Vout'$_{1-m}$(t) which are recombined at the signal output node 252 to generate the time-varying output signal Vout'(t).

Figure 6:
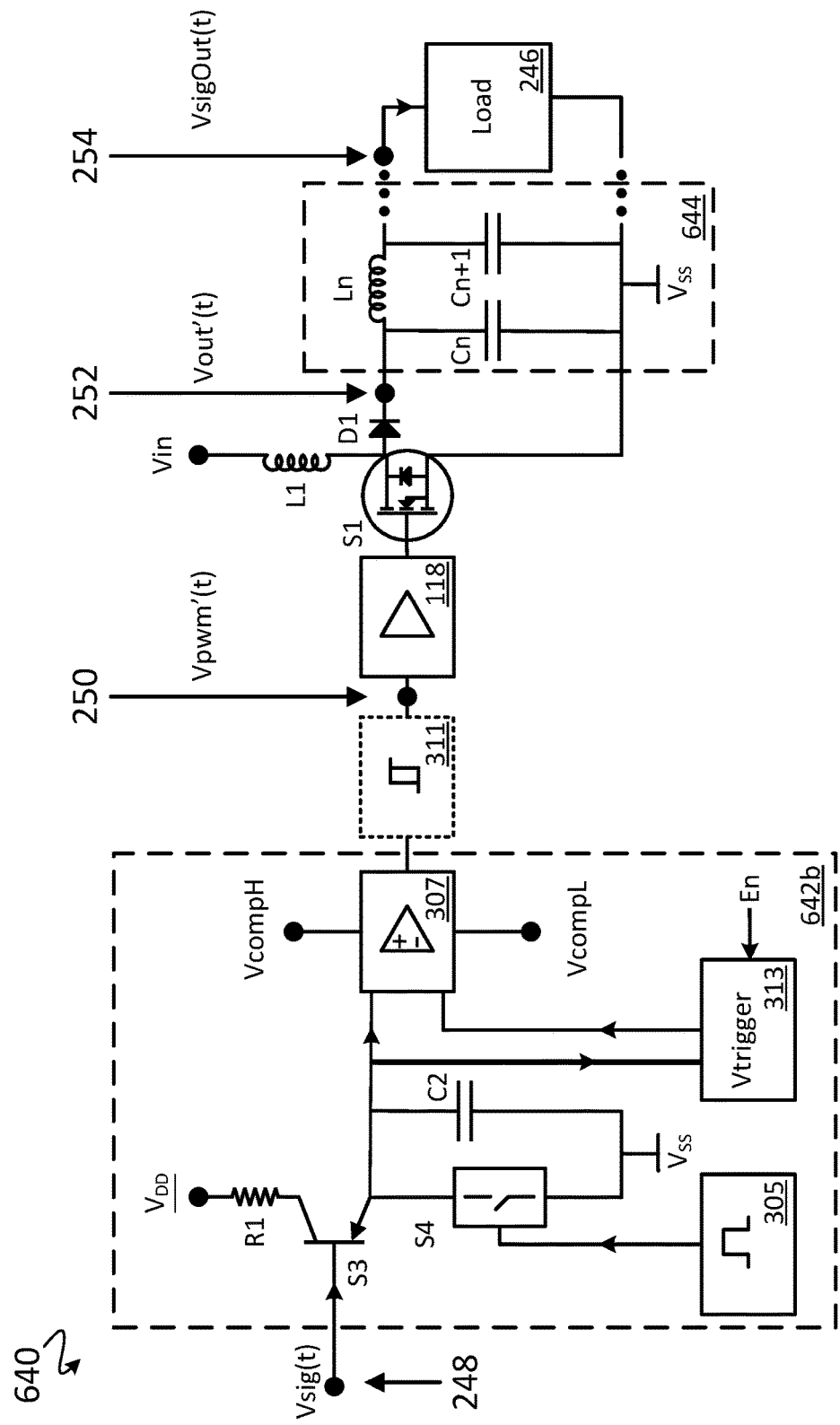
FIG. 6 is a simplified circuit diagram of a high-speed open loop switch-mode boost converter, in accordance with some embodiments.

FIG. 6 illustrates a simplified circuit diagram of a high-speed, open-loop switch-mode boost converter ("open-loop converter") 640 with linear signal characteristics, in accordance with some embodiments. Like numbered elements of the open-loop converter 640 may have similar descriptions as corresponding like-numbered elements of the converter 100 of FIG. 1A and the open-loop converter 240 of FIG. 2A, although design considerations may cause actual implementations of these elements to be rendered differently in the different circuits. Additionally, the open-loop converter 640 includes an embodiment of a switching signal generator circuit portion 642$b$ similar to the switching signal generator circuit 342$b$ of FIG. 3C and a filter circuit portion 644 similar to the filter circuit 444 of FIG. 4A. The open-loop converter 640 advantageously generates a filtered time-varying output signal VsigOut(t) that relates substantially linearly to the time-varying input signal Vsig(t).

Figure 7:
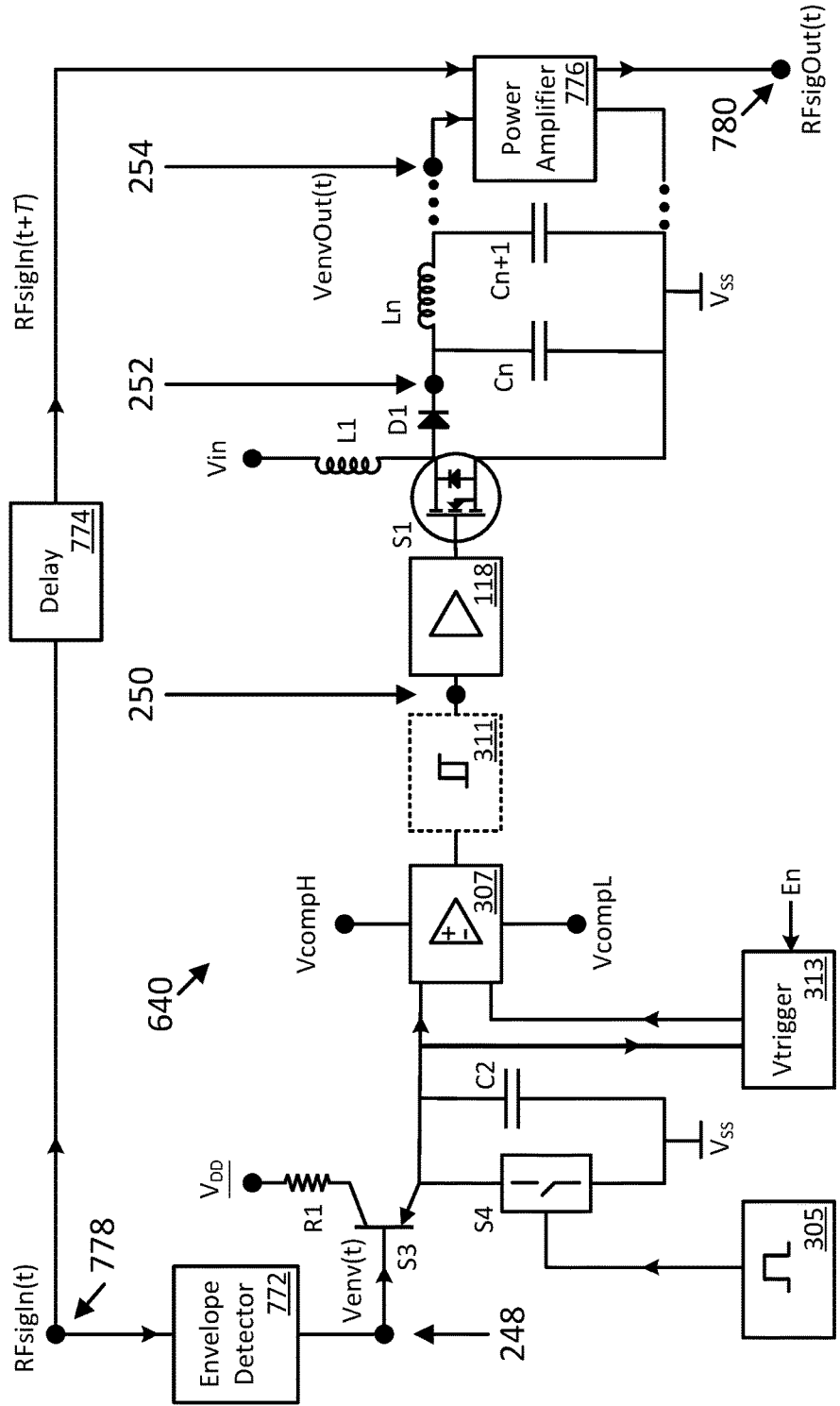
FIG. 7 is a simplified circuit diagram of a radio frequency (RF) amplifier implemented using a high-speed open-loop switch-mode boost converter, in accordance with some embodiments.

FIG. 7 illustrates a simplified circuit diagram of a radio-frequency (RF) amplifier circuit 740 capable of high-speed open-loop envelope tracking, in accordance with some embodiments. The RF amplifier circuit 740 includes an embodiment of the open-loop converter 640 as shown and described with reference to FIG. 6. Additionally, the RF amplifier circuit 740 generally includes an envelope detector circuit 772, a signal delay circuit 774, and a power amplifier circuit 776. The RF amplifier circuit 740 receives an RF input signal RFsigIn(t) at an input node 778. The envelope detector circuit 772 is a circuit suitable for generating a time-varying envelope signal Venv(t) that corresponds to an envelope of the RF input signal RFsigIn(t). The time-varying envelope signal Venv(t) is received at the signal input node 248 of the open-loop converter 640. In some embodiments, a maximum frequency component fMAX (Venv(t)) of the time-varying envelope signal Venv(t) is greater than 10 MHz. The open-loop converter 640 generates a filtered time-varying output signal VenvOut(t) at the signal output node 254. The filtered time-varying output signal VenvOut(t) is received by the power amplifier circuit 776 and is used thereby as a power rail. The power amplifier circuit 776 receives a delayed RF input signal RFsigIn(t+T), delayed by the signal delay circuit 774, and generates an amplified signal RFsigOut(t) at an RF signal output node 780. The RF amplifier circuit 740 implemented with the open-loop converter 640 advantageously uses a single boost stage (e.g., the switch S1) and does not require an additional switch-mode buck power converter or linear power converter. Thus, the overall efficiency of the RF amplifier circuit 740 is improved over typical RF amplifier circuits having additional switch-mode converters, and/or linear power converters.

Figure 8:
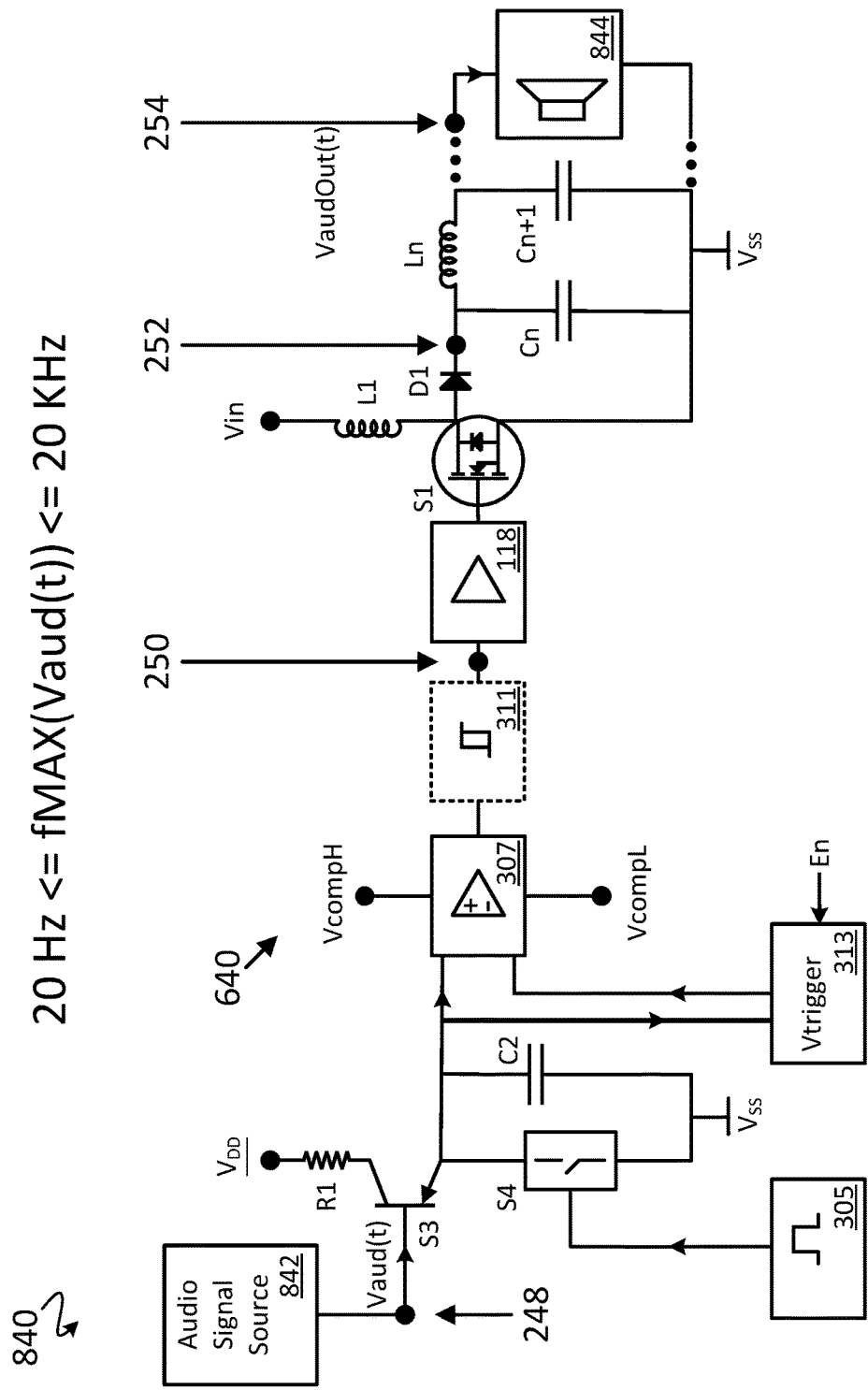
FIG. 8 is a simplified circuit diagram of an audio amplifier implemented using a high-speed open-loop switch-mode boost converter, in accordance with some embodiments.
Figure 6:
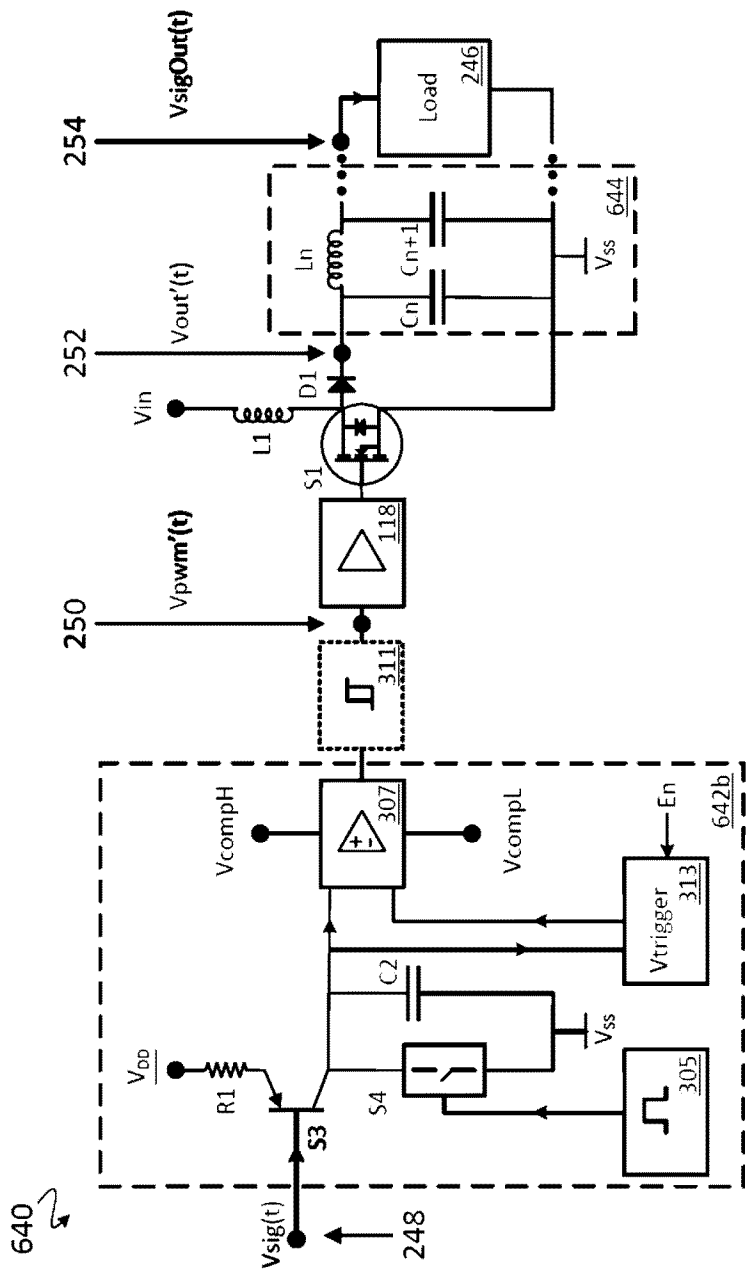
Figure 7:
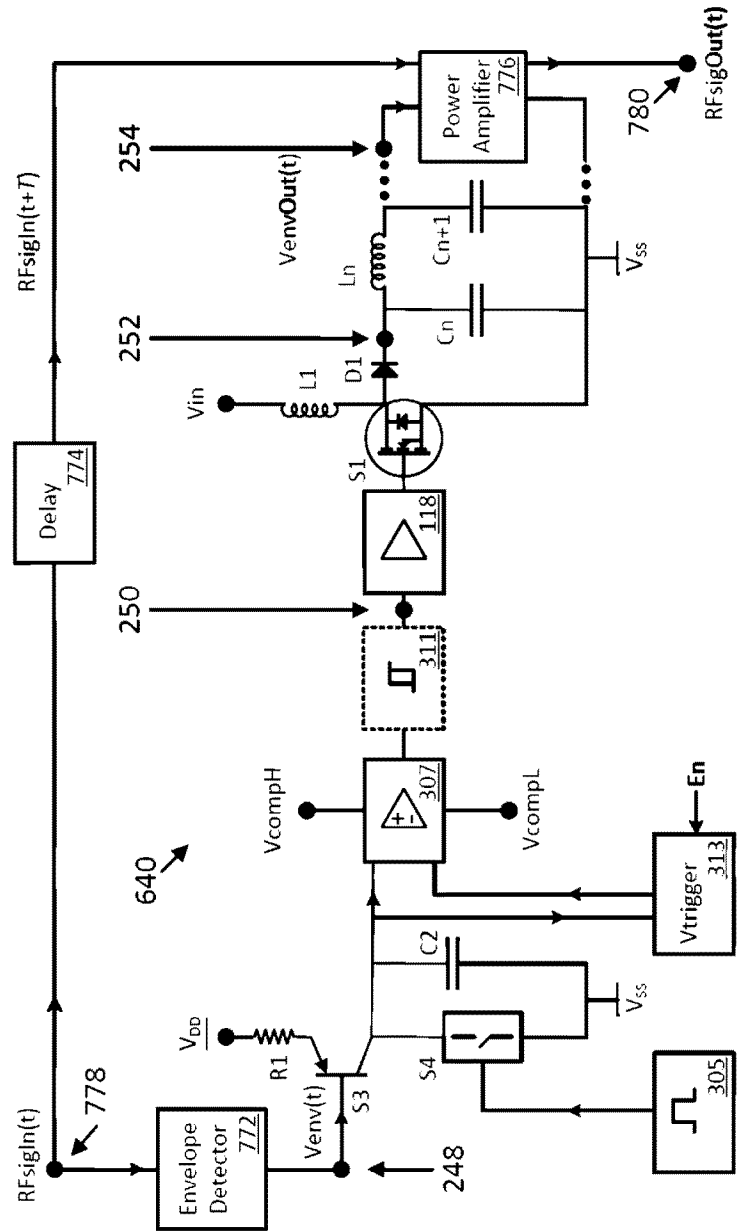
Figure 8:
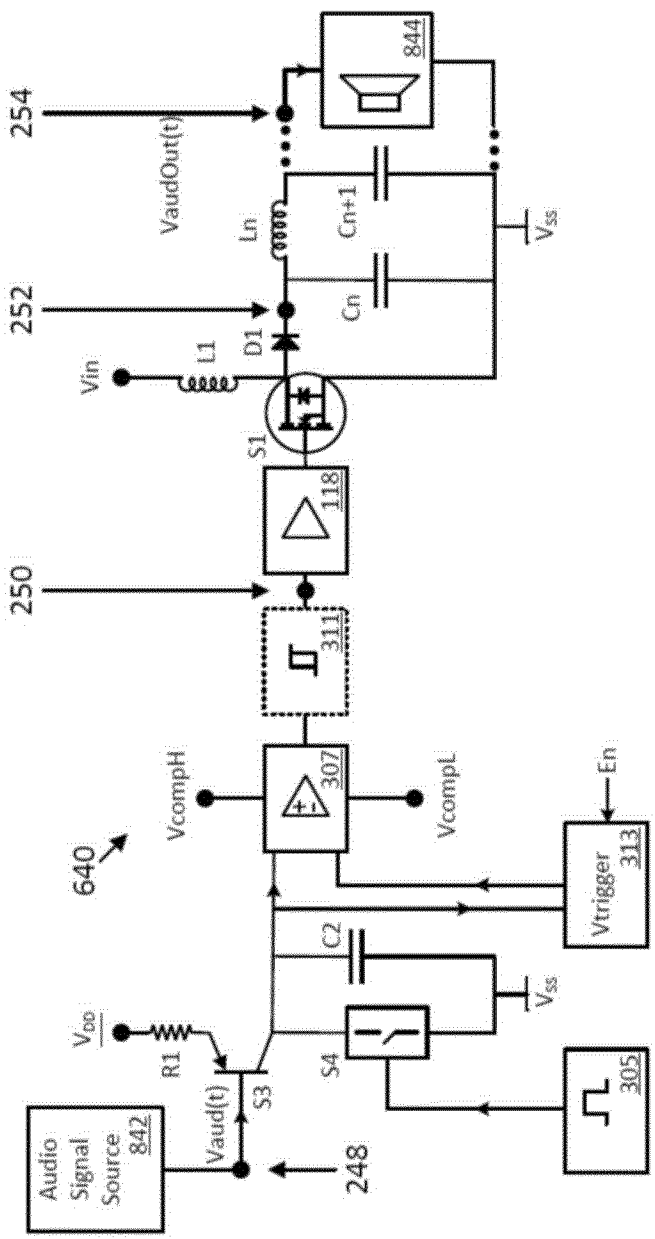

FIG. 8 illustrates a simplified circuit diagram of an audio amplifier circuit 840 with high-speed open-loop envelope tracking, in accordance with some embodiments. The audio amplifier circuit 840 includes an embodiment of the open-loop converter 640 as shown and described with reference to FIG. 6. Additionally, the audio amplifier circuit 840 generally includes an audio signal source 842 and an audio transducer or downstream audio circuitry 844 (e.g., a speaker, additionally amplification, or additional signal conditioning circuitry). The audio amplifier circuit 840 receives a time-varying audio signal Vaud(t) from the audio signal source 842 at the signal input node 248 of the open-loop converter 640. In some embodiments, a maximum frequency component fMAX(Vaud(t)) of the time-varying audio signal Vaud(t) is greater than 20 Hz and less than or equal to 20 kHz. The open-loop converter 640 generates a filtered time-varying output signal VaudOut(t) at the signal output node 254. The filtered time-varying output signal VaudOut(t) is received by the audio transducer or downstream audio circuitry 844. The audio amplifier circuit 840 implemented with the open-loop converter 640 advantageously uses a single boost stage (e.g., the switch S1) and does not use an additional switch-mode buck power converter or linear power converter. Thus, the overall efficiency of the audio amplifier circuit 840 is improved over audio amplifier circuits having additional switch-mode converters, and/or linear power converters.

In the preceding description, like reference numbers were used to identify like elements. Furthermore, drawings are intended to illustrate major features of example embodiments in a diagrammatic manner. The drawings are not intended to depict every feature of actual embodiments nor relative dimensions of the depicted elements and are not drawn to scale. Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An open-loop switch-mode boost converter comprising:
   a switching signal generator circuit for generating a switching signal, the switching signal generator circuit comprising a signal input node for receiving a time-varying input signal, and a switching signal output node for outputting the switching signal, a duty-cycle of the switching signal having a first non-linear relationship to an amplitude of the time-varying input signal;
   a switch-mode boost amplifier ("amplifier") circuit comprising an input voltage node for receiving an input voltage, a switch driver input node coupled to the switching signal output node for receiving the switching signal, and a signal output node for outputting a time-varying output signal, an amplitude of the time-varying output signal having a second non-linear relationship to the duty-cycle of the switching signal, and the time-varying output signal having a linear relationship to the time-varying input signal based on the first non-linear relationship and the second non-linear relationship; and
   a filter circuit with a filter input node coupled to the signal output node of the amplifier circuit to receive the time-varying output signal, and a filter output node for outputting a filtered time-varying output signal, the filter circuit being of a higher order than a second-order filter;
   wherein:
   the switching signal generator circuit is communicatively isolated from the signal output node and the filter output node;
   the time-varying input signal has a first maximum frequency component, the first maximum frequency component being substantially greater than DC; and
   the filtered time-varying output signal has a second maximum frequency component, the second maximum frequency component being substantially the same as the first maximum frequency component.

2. The open-loop switch-mode boost converter of claim 1, wherein:
   the switching signal has a switching frequency that is at least 2 times greater than the first maximum frequency component of the time-varying input signal; and
   the filter circuit substantially passes, from the filter input node to the filter output node, first frequencies that are equal to or less than the first maximum frequency component, and substantially attenuates second frequencies that are greater than the first maximum frequency component.

3. The open-loop switch-mode boost converter of claim 1, wherein:
the first maximum frequency component of the time-varying input signal is greater than 1 MHz.

4. The open-loop switch-mode boost converter of claim 1, wherein the switching signal generator circuit comprises:
a capacitor comprising a first terminal coupled to a bias voltage node;
a voltage-to-current conversion circuit having a first node coupled to a positive voltage node, a second node coupled to a second terminal of the capacitor, and a current conduction control node coupled to the signal input node for receiving the time-varying input signal and controlling a charging current flow from the positive voltage node to the capacitor to generate a ramp signal, the charging current flow being proportional to an amplitude of the time-varying input signal;
a discharge switch comprising a high-side coupled to the second terminal of the capacitor, a low-side coupled to the bias voltage node, and a switch control node coupled to a switch control circuit to control a discharging current flow from the capacitor to the bias voltage node;
a trigger level generation circuit for generating a trigger voltage, the trigger level generation circuit comprising a trigger voltage output node for outputting the trigger voltage; and
a voltage comparison circuit with a first input coupled to the second terminal of the capacitor and a second input coupled to the trigger level generation circuit for receiving the trigger voltage, the voltage comparison circuit having an upper voltage comparison limit.

5. The open-loop switch-mode boost converter of claim 4, wherein:
a maximum ramp voltage of the ramp signal is about equal to the upper voltage comparison limit, the maximum ramp voltage being based on one or more of the voltage-to-current conversion circuit, a capacitance value of the capacitor, a discharge frequency of the discharge switch and a discharge duty-cycle of discharge switch.

6. The open-loop switch-mode boost converter of claim 5, wherein:
a discharge period of the discharge switch is equal to or greater than a time duration to fully discharge the capacitor to the bias voltage node when the discharge switch is in a conduction state; and
the discharge frequency of the discharge switch is equal to or greater than 2 times the first maximum frequency component of the time-varying input signal.

7. The open-loop switch-mode boost converter of claim 4, wherein the trigger level generation circuit further comprises:
a voltage input node coupled to the second terminal of the capacitor to receive a plurality of ramp voltages of the ramp signal, wherein the trigger level generation circuit:
samples the plurality of ramp voltages to generate a plurality of ramp voltage samples;
determines a minimum ramp peak voltage using the plurality of ramp voltage samples; and
generates the trigger voltage based on the minimum ramp peak voltage.

8. The open-loop switch-mode boost converter of claim 7, wherein:
the trigger voltage is greater than a ground voltage and less than or equal to the minimum ramp peak voltage.

9. The open-loop switch-mode boost converter of claim 4, wherein the trigger level generation circuit further comprises:
a fixed bias voltage node that provides the trigger voltage, wherein the trigger voltage is based on a fixed percentage of a voltage rail of the voltage comparison circuit.

10. The open-loop switch-mode boost converter of claim 1, wherein the amplifier circuit comprises:
a first switch driver circuit with a first input node coupled to the switching signal output node for receiving the switching signal, and a first drive signal output node for outputting a first drive signal;
a first switching transistor with a first drive node coupled to the first drive signal output node for receiving the first drive signal, a first high-side coupled to the input voltage node through a first inductor, and a first low-side coupled to a bias voltage node; and
a first output rectifier coupled between the first high-side of the first switching transistor and the signal output node of the amplifier circuit.

11. The open-loop switch-mode boost converter of claim 10, further comprising:
a semiconductor device, the semiconductor device comprising:
a monolithic substrate; and
an active layer on the monolithic substrate;
wherein:
the active layer comprises the switching signal generator circuit, the first switch driver circuit, and the first switching transistor.

12. The open-loop switch-mode boost converter of claim 10, wherein the amplifier circuit further comprises:
a second switch driver circuit with a second input node coupled to another switching signal output node of the switching signal generator circuit for receiving another switching signal, and a second drive signal output node for outputting a second drive signal;
a second switching transistor with a second drive node coupled to the second drive signal output node for receiving the second drive signal, a second high-side coupled to the input voltage node through a second inductor, and a second low-side coupled to the bias voltage node; and
a second output rectifier coupled between the second high-side of the second switching transistor and the signal output node of the amplifier circuit.

13. The open-loop switch-mode boost converter of claim 1, wherein:
the filter circuit comprises a low-pass filter circuit selected from a group of filters consisting of a Chebyshev filter circuit, a Butterworth filter circuit, a Bessel filter circuit, and an Elliptic filter circuit.

14. The open-loop switch-mode boost converter of claim 13, wherein:
the low-pass filter circuit has a 3 dB cutoff frequency that is greater than the first maximum frequency component of the time-varying input signal.

15. The open-loop switch-mode boost converter of claim 1, wherein the filter circuit comprises:
a first filtering capacitor coupled in parallel between the filter input node and a bias voltage node;
a first filtering inductor, a first terminal of the first filtering inductor being coupled to the filter input node, and a second terminal of the first filtering inductor being coupled to the filter output node; and a second filtering capacitor coupled in parallel between the second terminal of the first filtering inductor and the bias voltage node.

16. The open-loop switch-mode boost converter of claim 15, wherein the filter circuit further comprises:
a second filtering inductor coupled in series between the second terminal of the first filtering inductor and the filter output node;
a third filtering capacitor coupled in parallel between a first terminal of the second filtering inductor and the bias voltage node; and
a fourth filtering capacitor coupled in parallel between a second terminal of the second filtering inductor and the bias voltage node.

17. The open-loop switch-mode boost converter of claim 1, wherein:
the linear relationship between the time-varying input signal and the time-varying output signal is based on a first amplitude of the time-varying input signal and a second amplitude of the time-varying output signal, the second amplitude being substantially linearly proportional to the first amplitude of the time-varying output signal.

18. The open-loop switch-mode boost converter of claim 1, further comprising:
an audio input circuit, the signal input node of the switching signal generator circuit being coupled to the audio input circuit to receive an audio signal; and
an audio transducer circuit coupled to the filter output node of the filter circuit to receive an amplified audio signal;
wherein:
the time-varying input signal is the audio signal; and
the amplified audio signal is the filtered time-varying output signal.

19. The open-loop switch-mode boost converter of claim 1, further comprising:
an envelope detector circuit having a signal input node to receive an input signal, and an envelope signal output node coupled to the signal input node of the switching signal generator circuit to output an envelope signal, the envelope signal being a signal envelope of the input signal; and
a power amplifier (PA) circuit having a PA signal input node to receive the input signal, a PA signal output node to output an amplified signal, a PA low-side bias node, and a PA high-side bias node coupled to the filter output node of the filter circuit to receive an amplified envelope signal;

wherein:
the time-varying input signal is the envelope signal; and
the amplified envelope signal is the filtered time-varying output signal.

20. A method for amplifying a time-varying signal, the method comprising:
receiving a time-varying input signal at a signal input node of a switching signal generator circuit;
generating a switching signal using the switching signal generator circuit, a duty-cycle of the switching signal having a first non-linear relationship to an amplitude of the time-varying input signal;
outputting the switching signal from a switching signal output node of the switching signal generator circuit;
receiving the switching signal from the switching signal output node of the switching signal generator circuit at a switch driver input node of a switch-mode boost amplifier ("amplifier") circuit;
receiving an input voltage at an input voltage node of the amplifier circuit;
outputting a time-varying output signal from a signal output node of the amplifier circuit, an amplitude of the time-varying output signal having a second non-linear relationship to the duty-cycle of the switching signal, and the time-varying output signal having a linear relationship to the time-varying input signal based on the first non-linear relationship and the second non-linear relationship;
receiving the time-varying output signal from the signal output node of the amplifier circuit at a filter input node of a filter circuit, the filter circuit being of a higher order than a second-order filter; and
outputting a filtered time-varying output signal from a filter output node of the filter circuit;
wherein:
the switching signal generator circuit is communicatively isolated from the signal output node and the filter output node;
the time-varying input signal has a first maximum frequency component, the first maximum frequency component being substantially greater than DC; and
the filtered time-varying output signal has a second maximum frequency component, the second maximum frequency component being substantially the same as the first maximum frequency component.

* * * * *

UNITED STATES PATENT AND TRADEMARK OFFICE
CERTIFICATE OF CORRECTION

PATENT NO. : 10,135,339 B1
APPLICATION NO. : 15/879284
DATED : November 20, 2018
INVENTOR(S) : Steven E. Rosenbaum et al.

It is certified that error appears in the above-identified patent and that said Letters Patent is hereby corrected as shown below:

In the Drawings

Sheet 12, Fig. 6: The schematic representation of switch S3 is oriented incorrectly and should be flipped vertically such that the emitter of the switch S3 is connected to the resistor R1 and the collector of the switch S3 is connected to the switch S4 (as shown in FIG. 3B) as shown on attached page.

Sheet 13, Fig. 7: The schematic representation of switch S3 is oriented incorrectly and should be flipped vertically such that the emitter of the switch S3 is connected to the resistor R1 and the collector of the switch S3 is connected to the switch S4 (as shown in FIG. 3B) as shown on attached page.

Sheet 14, Fig. 8: The schematic representation of switch S3 is oriented incorrectly and should be flipped vertically such that the emitter of the switch S3 is connected to the resistor R1 and the collector of the switch S3 is connected to the switch S4 (as shown in FIG. 3B) as shown on attached page.

Signed and Sealed this
Twenty-fifth Day of June, 2019

Andrei Iancu
*Director of the United States Patent and Trademark Office*